US011392255B2

(12) United States Patent
Bang

(10) Patent No.: US 11,392,255 B2
(45) Date of Patent: Jul. 19, 2022

(54) DISPLAY DEVICE WITH SINGLE WIRE AND DOUBLE WIRE STACKED STRUCTURE IN THE NON-DISPLAY AREA

(71) Applicant: Samsung Display Co., LTD., Yongin-si (KR)

(72) Inventor: Ki Ho Bang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 82 days.

(21) Appl. No.: 16/926,758

(22) Filed: Jul. 12, 2020

(65) Prior Publication Data

US 2021/0149524 A1 May 20, 2021

(30) Foreign Application Priority Data

Nov. 15, 2019 (KR) .................. 10-2019-0146574

(51) Int. Cl.
G06F 3/044 (2006.01)
H01L 27/32 (2006.01)
G06F 3/041 (2006.01)

(52) U.S. Cl.
CPC .......... G06F 3/0445 (2019.05); H01L 27/323 (2013.01); *G06F 3/0412* (2013.01); *G06F 2203/04107* (2013.01)

(58) Field of Classification Search
None
See application file for complete search history.

(56) References Cited

U.S. PATENT DOCUMENTS

| 10,481,729 | B2 | 11/2019 | Park |
| 10,497,896 | B2 | 12/2019 | Lee et al. |
| 2018/0033831 | A1 | 2/2018 | An et al. |
| 2019/0131379 | A1* | 5/2019 | Won .................... H01L 51/5284 |
| 2020/0067010 | A1* | 2/2020 | Lee ........................ G06F 3/0446 |

FOREIGN PATENT DOCUMENTS

| KR | 10-2019-0009147 | 1/2019 |
| KR | 10-2019-0025798 | 3/2019 |
| KR | 10-1998831 | 7/2019 |

* cited by examiner

*Primary Examiner* — Amare Mengistu
*Assistant Examiner* — Sarvesh J Nadkarni
(74) *Attorney, Agent, or Firm* — H.C. Park & Associates, PLC

(57) ABSTRACT

A display device including a display panel including a display area, a non-display area, and a protrusion member disposed in the non-display area, and a touch sensing unit disposed on the display panel and including a touch electrode and a wire portion connected to the touch electrode, in which the touch sensing unit includes a first metal layer, a first insulating layer disposed on the first metal layer, a second metal layer disposed on the first insulating layer, and a plurality of contact holes disposed between the first metal layer and the second metal layer, and the wire portion has a double wire structure including the first metal layer and the second metal layer in the non-display area, and has a single wire structure including any one of the first metal layer and the second metal layer on the protrusion member.

20 Claims, 26 Drawing Sheets

FIG. 11
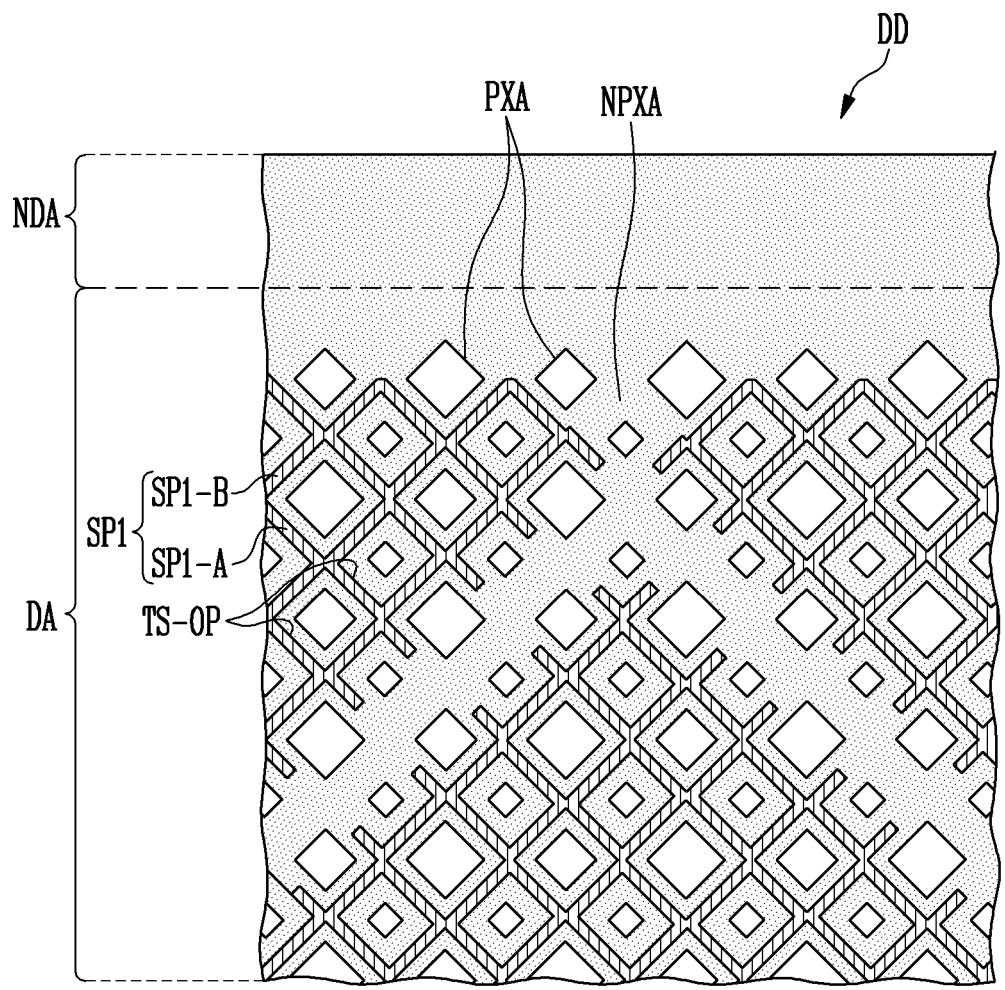
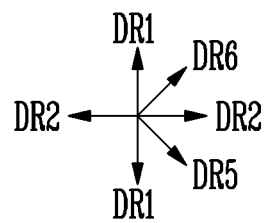

DISPLAY DEVICE WITH SINGLE WIRE AND DOUBLE WIRE STACKED STRUCTURE IN THE NON-DISPLAY AREA

CROSS-REFERENCE TO RELATED APPLICATION

This application claims priority from and the benefit of Korean Patent Application No. 10-2019-0146574, filed on Nov. 15, 2019, which is hereby incorporated by reference for all purposes as if fully set forth herein.

BACKGROUND

Field

Exemplary embodiments of the invention relate generally to a display device.

Discussion of the Background

An electronic device such as a smart phone, a tablet PC, a digital camera, a notebook computer, a navigation device, and a smart television that provide an image to a user includes a display device for displaying the image. The display device includes a display panel that generates and displays the image, as well as various input devices.

Recently, a touch sensing unit that recognizes a touch input has been applied to a display device mainly on a smartphone or a tablet PC. The touch sensing unit is replacing a conventional physical input device, such as a keypad or the like, due to the convenience of a touch method.

The above information disclosed in this Background section is only for understanding of the background of the inventive concepts, and, therefore, it may contain information that does not constitute prior art.

SUMMARY

Display devices constructed according to exemplary embodiments of the invention include a wire portion structure capable of improving a short defect that may occur between adjacent wire portions in a touch sensing unit.

Additional features of the inventive concepts will be set forth in the description which follows, and in part will be apparent from the description, or may be learned by practice of the inventive concepts.

A display device according to an exemplary embodiment includes a display panel including a display area, a non-display area, and a protrusion member disposed in the non-display area, and a touch sensing unit disposed on the display panel and including a touch electrode and a wire portion connected to the touch electrode, in which the touch sensing unit includes a first metal layer, a first insulating layer disposed on the first metal layer, a second metal layer disposed on the first insulating layer, and a plurality of contact holes disposed between the first metal layer and the second metal layer, and the wire portion has a double wire structure including the first metal layer and the second metal layer in the non-display area, and has a single wire structure including any one of the first metal layer and the second metal layer on the protrusion member.

The wire portion may include a plurality of first touch signal lines and a plurality of second touch signal lines that are alternately disposed along an extension direction of the protrusion member, and the first touch signal lines and the second touch signal lines may extend in a direction crossing the extension direction of the protrusion member.

A first metal wire of the first touch signal lines including the first metal layer may overlap the protrusion member, and a second metal wire of the first touch signal lines including the second metal layer may not overlap the protrusion member, and a first metal wire of the second touch signal lines including the first metal layer may not overlap the protrusion member, and a second metal wire of the second touch signal lines including the second metal layer may overlap the protrusion member.

A width of the first metal wire of the first and second touch signal lines and a width of the second metal wire of the first and second touch signal lines may be substantially the same.

The first metal layer of the first and second touch signal lines and the second metal layer of the first and second touch signal lines may be electrically connected to each other through the contact holes.

The touch electrode may include a plurality of first touch electrodes extending in a first direction and second touch electrodes extending in a second direction crossing the first direction.

The first touch electrodes may include a plurality of first touch sensor portions and a plurality of first connection portions connecting the first touch sensor portions, and the second touch electrodes may include a plurality of second touch sensor portions and a plurality of second connection portions connecting the second touch sensor portions.

The first touch sensor portions, the first connection portions, and the second touch sensor portions may include the second metal layer, and the second connection portions may include the first metal layer.

The first touch electrodes and the second touch electrodes may cross each other and be insulated from each other by the first insulating layer.

The protrusion member may include a first protrusion member disposed to surround the display area, a second protrusion member disposed to surround the first protrusion member, and a bank portion disposed on an outer side of the second protrusion member.

The display device may further include a pad electrode disposed on an outer side of the bank portion, in which the wire portion may connect the touch electrode and the pad electrode to each other.

A height of the second protrusion member may be greater than a height of the first protrusion member.

The touch sensing unit may further include a second insulating layer disposed on the second metal layer.

A display device according to another exemplary embodiment includes a base substrate divided into a display area and a non-display area adjacent to the display area, a circuit layer disposed on the base substrate, a light emitting element layer on the display area, an encapsulation layer covering the light emitting element layer, a touch sensing unit disposed on the encapsulation layer and including a touch electrode and a wire portion connected to the touch electrode, and a protrusion member disposed in the non-display area, in which the touch sensing unit includes a first metal layer, a first insulating layer disposed on the first metal layer, a second metal layer disposed on the first insulating layer, and a plurality of contact holes disposed between the first metal layer and the second metal layer, and the wire portion has a double wire structure including the first metal layer and the second metal layer in the non-display area, and has a single wire structure including any one of the first metal layer and the second metal layer on the protrusion member.

The wire portion may include a plurality of first touch signal lines and a plurality of second touch signal lines that are alternately disposed along an extension direction of the protrusion member, and the first touch signal lines and the second touch signal lines may extend in a direction crossing the extension direction of the protrusion member.

A first metal wire of the first touch signal lines including the first metal layer may overlap the protrusion member, and a second metal wire of the first touch signal lines including the second metal layer may not overlap the protrusion member, and a first metal wire of the second touch signal lines including the first metal layer may not overlap the protrusion member, and a second metal wire of the second touch signal lines including the second metal layer may overlap the protrusion member.

The first metal layer of the first and second touch signal lines and the second metal layer of the first and second touch signal lines may be electrically connected to each other through the contact holes.

The touch sensing unit may further include a second insulating layer disposed on the second metal layer.

The encapsulation layer may include a first inorganic layer, a second inorganic layer, and an organic layer interposed between the first inorganic layer and the second inorganic layer.

The first inorganic layer and the second inorganic layer of the encapsulation layer may be sequentially stacked on the protrusion member.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 11 is a partially enlarged view of region BB of FIG. 10 according to an exemplary embodiment.

DETAILED DESCRIPTION

Figure 1:
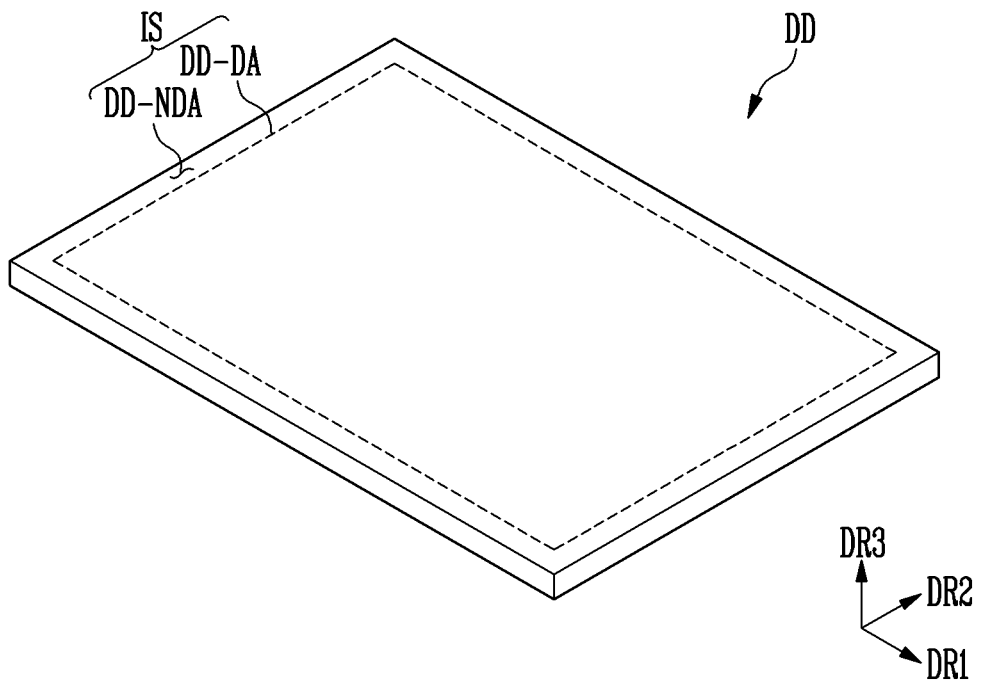
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of a display device according to an exemplary embodiment.

Referring to FIG. 1, a display device DD includes a display surface IS, on which an image is displayed and is parallel to a surface defined by a first direction DR1 and a second direction DR2. A third direction DR3 indicates a normal direction of the display surface IS, such as a thickness direction of the display device DD. A front surface (or an upper surface) and a back surface (or a lower surface) of each of members are divided by the third direction DR3. However, directions indicated by the first to third directions DR1, DR2, and DR3 may be converted to other directions as being relative concepts. Hereinafter, the first to third directions refer to the same reference numerals in directions indicated by the first to third directions DR1, DR2, and DR3, respectively.

The display surface IS of the display device DD may include a plurality of areas. The display device DD includes a display area DD-DA in which the image is displayed, and a non-display area DD-NDA adjacent to the display area DD-DA. The non-display area DD-NDA an area where an image may not be displayed. For example, the display area DD-DA may have substantially a quadrangular shape. The non-display area DD-NDA may surround the display area DD-DA. However, the inventive concepts are not limited thereto, and a shape of the display area DD-DA and a shape of the non-display area DD-NDA may be relatively designed.

Figure 2:
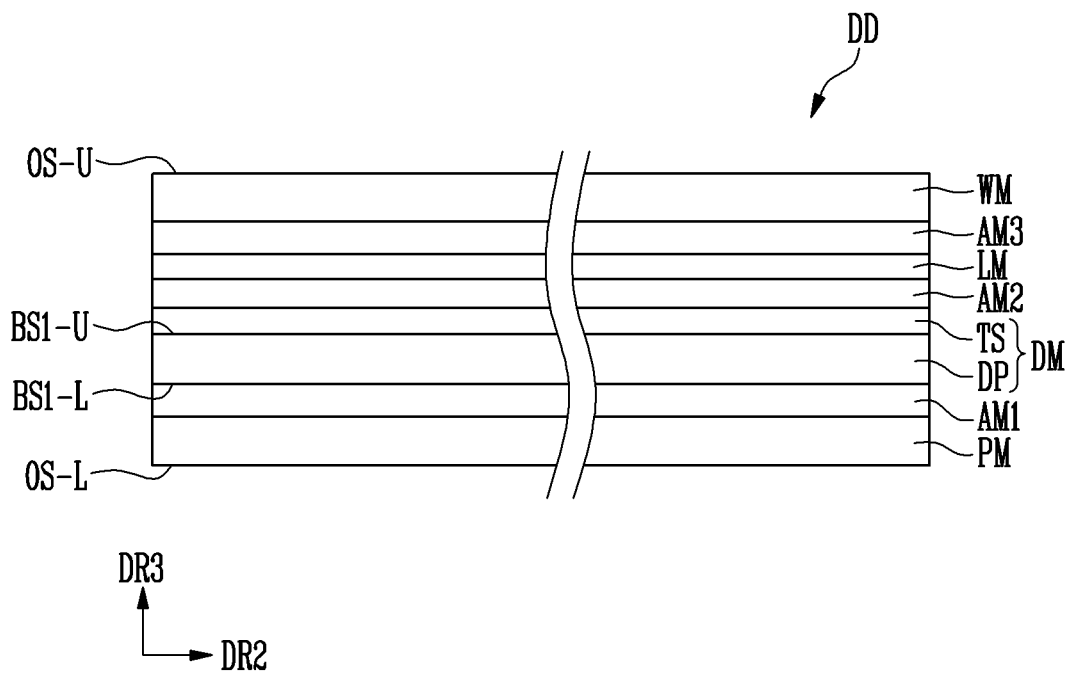
FIG. 2 is a cross-sectional view of the display device according to an exemplary embodiment.

FIG. 2 is a cross-sectional view of the display device according to an exemplary embodiment. FIG. 2 illustrates a cross-section defined by the second direction DR2 and the third direction DR3.

Referring to FIG. 2, the display device DD may include a protective film PM, a display module DM, an optical member LM, a window WM, a first adhesive member AM1, a second adhesive member AM2, and a third adhesive member AM3. The display module DM is disposed between the protective film PM and the optical member LM. The optical member LM is disposed between the display module DM and the window WM. The first adhesive member AM1 couples the display module DM and the protective film PM to each other, the second adhesive member AM2 couples the display module DM and the optical member LM to each other, and the third adhesive member AM3 couples the optical member LM and the window WM to each other.

The protective film PM protects the display module DM. The protective film PM provides a first outer surface OS-L exposed to the outside, and provides an adhesive surface adhered to the first adhesive member AM1. The protective film PM prevents external moisture from penetrating into the display module DM and absorbs an external impact.

The protective film PM may include a plastic film as a base substrate. The protective film PM may include a plastic film including any one of polyethersulfone (PES), polyacrylate, polyetherimide (PEI), polyethylenenaphthalate (PEN), polyethylene terephthalate (PET), poly phenylene sulfide (PPS), polyarylate, polyimide (PI), polycarbonate (PC), polyarylene ether sulfone, and a combination thereof.

A material forming the protective film PM is not limited to plastic resins, and may include an organic/inorganic composite material. For example, the protective film PM may include a porous organic layer and an inorganic material filled in pores of the organic layer. The protective film PM may further include a functional layer formed on the plastic film. The functional layer may include a resin layer. The functional layer may be formed by a coating method. In some exemplary embodiments, the protective film PM may be omitted.

The window WM may protect the display module DM from an external impact and provide an input surface to a user. The window WM provides a second outer surface OS-U exposed to the outside, and provides an adhesive surface adhered to the third adhesive member AM3. The display surface IS shown in FIG. 1 may be the second outer surface OS-U.

The window WM may include a plastic film. The window WM may have a multilayer structure. The window WM may have a multilayer structure selected from a glass substrate, a plastic film, and a plastic substrate. The window WM may further include a bezel pattern. The multilayer structure may be formed through a continuous process or an adhesive process using an adhesive layer.

The optical member LM reduces an external light reflectance. The optical member LM may include at least a polarization film. The optical member LM may further include a retardation film. In some exemplary embodiments, the optical member LM may be omitted.

The display module DM may include an organic light emitting display panel DP and a touch sensing unit TS. The touch sensing unit TS is disposed on the organic light emitting display panel DP. In addition, in an exemplary embodiment, the touch sensing unit TS may be directly disposed on the organic light emitting display panel DP. As used herein, "directly disposed" may refer to "formed by a continuous process" without attaching elements using a separate adhesive layer.

The organic light emitting display panel DP may generate an image corresponding to input image data. The organic light emitting display panel DP provides a first display panel surface BS1-L and a second display panel surface BS1-U facing each other in the third direction DR3. In the illustrated exemplary embodiment, the display panel DP is exemplarily described with reference to an organic light emitting display panel DP, however, the inventive concepts are not limited thereto.

The touch sensing unit TS may obtain coordinate information of an external input. The touch sensing unit TS may sense an external input in a capacitive manner.

In some exemplary embodiments, the display module DM may further include an antireflection layer. The antireflection layer may include a color filter or a stack structure of conductive layer/insulating layer/conductive layer. The antireflection layer may reduce the external light reflectance by absorbing, canceling, or polarizing light incident from the outside. The antireflection layer may replace at least one function of the optical member LM.

Each of the first adhesive member AM1, the second adhesive member AM2, and the third adhesive member AM3 may be an organic adhesive layer, such as an optically clear adhesive film (OCA), an optically clear resin (OCR), or a pressure sensitive adhesive film (PSA). The organic adhesive layer may include an adhesive material, such as polyurethane, polyacrylic, polyester, polyepoxy and polyvinyl acetate.

Figure 3:
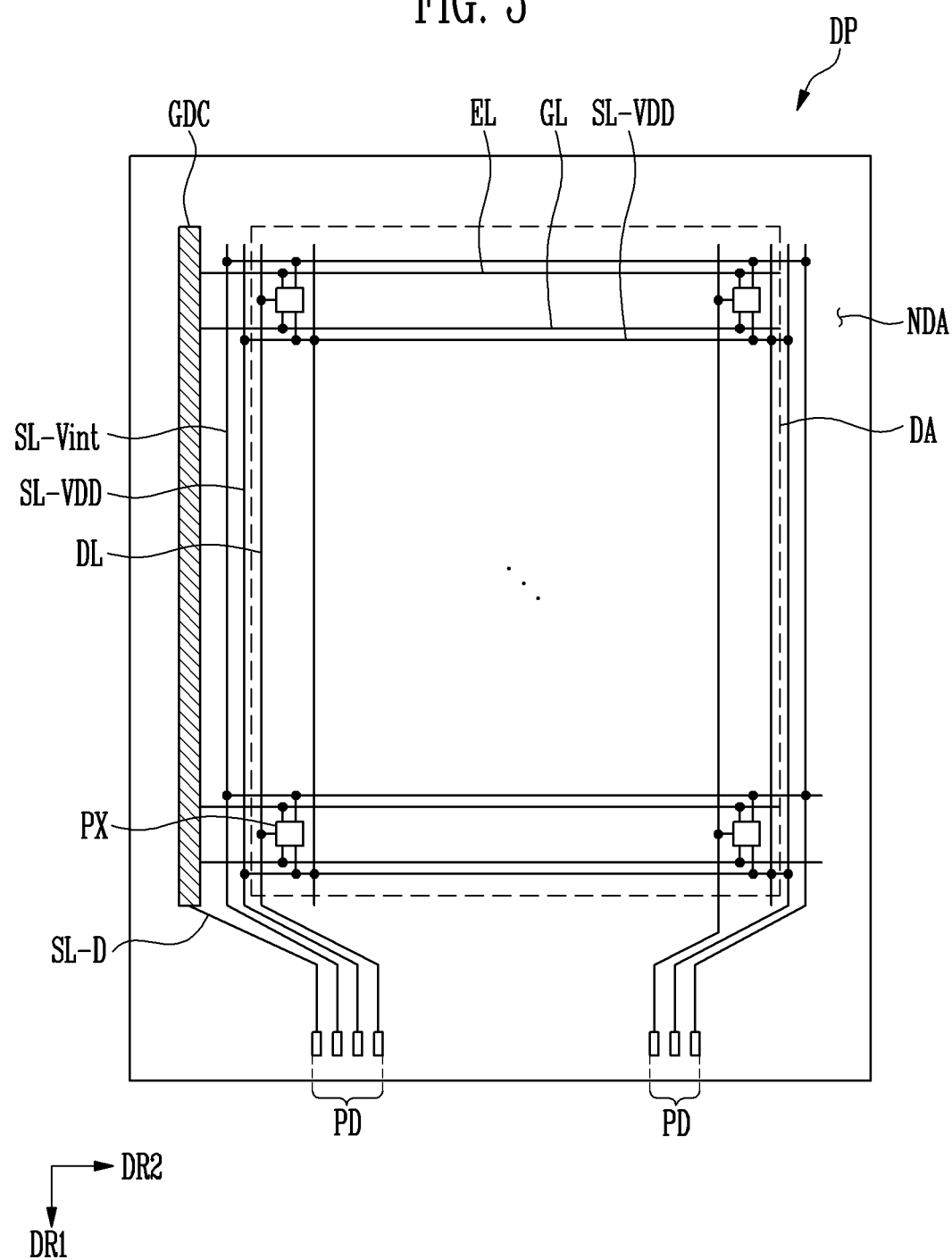
FIG. 3 is a plan view of a display panel according to an exemplary embodiment.
Figure 4:
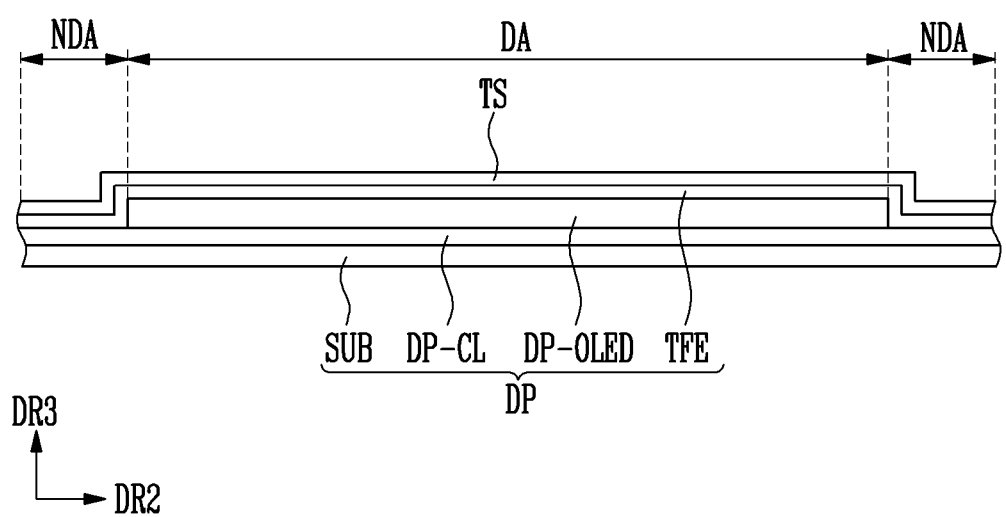
FIG. 4 is a cross-sectional view of a display module according to an exemplary embodiment.

FIG. 3 is a plan view of the organic light emitting display panel DP according to an exemplary embodiment, and FIG. 4 is a cross-sectional view of the display module DM according to an exemplary embodiment. For example, FIG. 4 may show a portion of a cross-section in a plane parallel to a plane defined by the second direction DR2 and the third direction DR3.

Referring to FIG. 3, the organic light emitting display panel DP includes a display area DA and a non-display area NDA on a plane. The display area DA and the non-display area NDA of the organic light emitting display panel DP correspond to the display area DD-DA (refer to FIG. 1) and the non-display area DD-NDA (refer to FIG. 1) of the display device DD (refer to FIG. 1), respectively. The display area DA and the non-display area NDA of the organic light emitting display panel DP may not necessarily be the same as the display area DD-DA (refer to FIG. 1) and the non-display area DD-NDA (refer to FIG. 1) of the display device DD (refer to FIG. 1), and may be changed according to a structure/design of the organic light emitting display panel DP.

The organic light emitting display panel DP includes a plurality of pixels PX. An area in which the plurality of pixels PX are disposed is defined as the display area DA. In the illustrated exemplary embodiment, the non-display area NDA may be defined along an edge of the display area DA.

The organic light emitting display panel DP includes gate lines GL, data lines DL, light emission lines EL, a control signal line SL-D, an initialization voltage line SL-Vint, a voltage line SL-VDD, and a pad portion PD.

The gate lines GL are respectively connected to corresponding pixels PX of the plurality of pixels PX, and the data lines DL are respectively connected to corresponding pixels PX of the plurality of pixels PX. Each of the light emission lines EL may be arranged in parallel with a corresponding gate line among the gate lines GL. The control signal line SL-D may provide control signals to a gate driving circuit GDC. The initialization voltage line SL-Vint may provide an initialization voltage to the plurality of pixels PX. The voltage line SL-VDD may be connected to the plurality of pixels PX to provide a first voltage to the plurality of pixels PX. The voltage line SL-VDD may include a plurality of lines extending in the first direction DR1 and a plurality of lines extending in the second direction DR2.

The gate driving circuit GDC to which the gate lines GL and the light emission lines EL are connected may be disposed on one side of the non-display area NDA. Some of the gate lines GL, the data lines DL, the light emission lines EL, the control signal lines SL-D, the initialization voltage line SL-Vint, and the voltage line SL-VDD may be disposed on the same layer, and others may be disposed on another layer.

The pad portion PD may be connected to one end of the data lines DL, the control signal line SL-D, the initialization voltage line SL-Vint, and the voltage line SL-VDD.

Referring to FIG. 4, the organic light emitting display panel DP may include a base substrate SUB, a circuit layer DP-CL disposed on the base substrate SUB, a light emitting element layer DP-OLED disposed on the circuit layer DP-CL, and an encapsulation layer TFE surrounding the light emitting element layer DP-OLED.

The base substrate SUB may include a plastic substrate, a glass substrate, a metal substrate, an organic/inorganic composite substrate, or the like. The plastic substrate may include at least one of acrylic resin, methacrylic resin, polyisoprene, vinyl resin, epoxy resin, urethane resin, cellulose resin, siloxane resin, polyimide resin, polyamide resin, and perylene resin. The base substrate SUB may be a flexible substrate. Alternatively, the base substrate SUB may be a rigid substrate.

The base substrate SUB may be divided into the display area DA and the non-display area NDA adjacent to the display area DA. The non-display area NDA may be disposed at an edge of the display area DA. However, the inventive concepts are not limited thereto, and in some exemplary embodiments, the non-display area NDA may be defined only on one side of the display area DA.

The circuit layer DP-CL may be disposed on the base substrate SUB. The circuit layer DP-CL may be disposed on the display area DA and the non-display area NDA of the base substrate SUB. The circuit layer DP-CL may include at least one pixel insulating layer, a plurality of conductive layers, and a semiconductor layer. The plurality of conductive layers of the circuit layer DP-CL may configure signal lines or a driving circuit of the pixel.

The light emitting element layer DP-OLED may include organic light emitting diodes. The light emitting element layer DP-OLED may be disposed on the display area DA. The organic light emitting diode will be described in more detail later with reference to FIG. 15.

The encapsulation layer TFE may be disposed on the light emitting element layer DP-OLED. The encapsulation layer TFE may be disposed to surround the light emitting element layer DP-OLED. The encapsulation layer TFE may cover and seal the light emitting element layer DP-OLED. The encapsulation layer TFE may include an inorganic layer and an organic layer. The encapsulation layer TFE may include at least two inorganic layers and an organic layer disposed therebetween. The inorganic layer protects the light emitting element layer DP-OLED from moisture/oxygen, and the organic layer protects the light emitting element layer DP-OLED from foreign substance, such as a dust particle. The inorganic layer may include a silicon nitride layer, a silicon oxy nitride layer, a silicon oxide layer, and the like. The organic layer may include an acrylic organic material, but is not limited thereto. The inorganic layer may be provided by a deposition method, and the organic layer may be provided using a coating process, without being limited thereto.

The touch sensing unit TS is disposed on the encapsulation layer TFE. The touch sensing unit TS may be directly disposed on the encapsulation layer TFE. However, the inventive concepts are not limited thereto, and in some exemplary embodiments, an inorganic layer may be disposed on the encapsulation layer TFE, and the touch sensing unit TS may be disposed on the inorganic layer. The inorganic layer may be a buffer layer. The inorganic layer may be at least one of a silicon nitride layer, a silicon oxy nitride layer, and a silicon oxide layer. However, the inventive concepts are not limited thereto. In addition, the buffer layer may be an organic layer. Although the buffer layer has been described as a separate layer, in some exemplary embodiments, the buffer layer may be included in the encapsulation layer TFE.

The touch sensing unit TS includes touch sensors and touch signal lines. The touch sensors and the touch signal lines may have a single layer or multilayer structure.

The touch sensors and the touch signal lines may include indium tin oxide (ITO), indium zinc oxide (IZO), zinc oxide (ZnO), indium tin zinc oxide (ITZO), PEDOT, a metal nanowire, and graphene. The touch sensors and the touch signal lines may include a metal layer, for example, molybdenum, silver, titanium, copper, aluminum, or an alloy thereof. The touch sensors and the touch signal lines may have the same layer structure or different layer structures. Details of the touch sensing unit TS will be described later.

Figure 5:
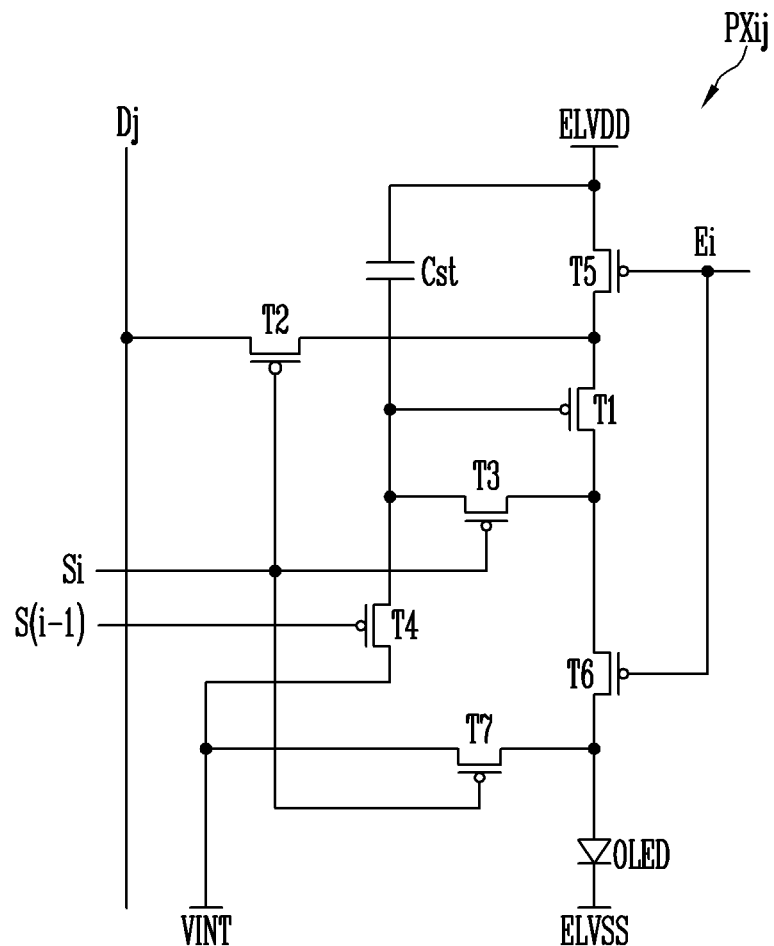
FIG. 5 is an equivalent circuit diagram of a pixel PX according to an exemplary embodiment.

FIG. 5 is an equivalent circuit diagram of the pixel PX according to an exemplary embodiment. FIG. 5 exemplarily illustrates an i-th pixel PXij connected to a j-th data line Dj among the plurality of data lines DL (refer to FIG. 3). Here, each of i and j may be a positive integer.

Referring to FIG. 5, the pixel PXij may include transistors T1, T2, T3, T4, T5, T6, and T7, a storage capacitor Cst, and an organic light emitting diode OLED.

Although the transistors according to the illustrated exemplary embodiment are shown as P-type transistors, in some exemplary embodiment, a pixel circuit performing the same function may be configured with N-type transistors.

One electrode of the storage capacitor Cst may be connected to a first power voltage line ELVDD, and another electrode of the storage capacitor Cst may be connected to a gate electrode of the transistor T1.

In the transistor T1, one electrode may be connected to another electrode of the transistor T5, another electrode may be connected to one electrode of the transistor T6, and the gate electrode may be connected to the other electrode of the storage capacitor Cst. The transistor T1 may be referred to as a driving transistor. The transistor T1 determines the amount of driving current flowing between the first power voltage line ELVDD and a second power voltage line ELVSS according to a potential difference between the gate electrode and a source electrode.

In the transistor T2, one electrode may be connected to the data line Dj, another electrode may be connected to one electrode of the transistor T1, and a gate electrode may be connected to the current scan line Si. The transistor T2 may be referred to as a switching transistor, a scan transistor, a gate transistor, or the like. The transistor T2 introduces a data voltage of the data line Dj into the pixel PXij when a scan signal of a turn-on level is applied to the current scan line Si.

In the transistor T3, one electrode is connected to the other electrode of the transistor T1, another is connected to the gate electrode of the transistor T1, and a gate electrode connected to the current scan line Si. The transistor T3 connects the transistor T1 in diode form when the scan signal of the turn-on level is applied to the current scan line Si.

In the transistor T4, one electrode is connected to the gate electrode of the transistor T1, another electrode is connected to the initialization voltage line VINT, and a gate electrode is connected to a previous scan line S(i−1). In another exemplary embodiment, the gate electrode of transistor T4 may be connected to another scan line. The transistor T4 transfers an initialization voltage VINT to the gate electrode of the transistor T1 to initialize a charge amount of the gate electrode of the transistor T1 when the scan signal of the turn-on level is applied to the previous scan line S(i−1).

In the transistor T5, one electrode is connected to the first power voltage line ELVDD, the other electrode is connected to the one electrode of the transistor T1, and a gate electrode is connected to the light emission line Ei. In the transistor T6, the one electrode is connected to the other electrode of the transistor T1, another electrode is connected to an anode electrode of the organic light emitting diode OLED, and a gate electrode is connected to the light emission line Ei. The transistors T5 and T6 may be referred to as light emission transistors. The transistors T5 and T6 form a driving current path between the first power voltage line ELVDD and the second power voltage line ELVSS to cause the organic light emitting diode OLED to emit light when a light emission signal of a turn-on level is applied.

In the transistor T7, one electrode is connected to the anode electrode of the organic light emitting diode OLED, another electrode is connected to the initialization voltage line VINT, and a gate electrode is connected to the current scan line Si. In another exemplary embodiment, the gate electrode of transistor T7 may be connected to another scan line. For example, the gate electrode of transistor T7 may be connected to the previous scan line S(i−1), a scan line previous to the previous scan line S(i−2), a next scan line S(i+1), or a scan line next to the next scan line S (i+2). The transistor T7 transfers an initialization voltage to the anode electrode of the organic light emitting diode OLED to initialize the charge amount accumulated in the organic light emitting diode OLED when the scan signal of the turn-on level is applied to the current scan line Si.

In the organic light emitting diode OLED, the anode electrode may be connected to the other electrode of the transistor T6, and a cathode electrode may be connected to the second power voltage line ELVSS.

Figure 6:
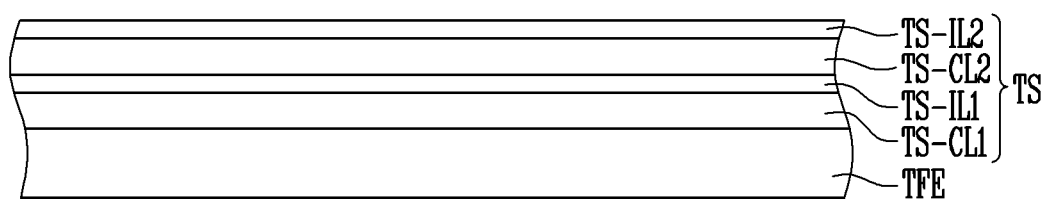
FIG. 6 is a cross-sectional view of a touch sensing unit according to an exemplary embodiment.

FIG. 6 is a cross-sectional view of the touch sensing unit according to an exemplary embodiment.

Referring to FIG. 6, the touch sensing unit TS may include a first conductive layer TS-CL1, a first insulating layer TS-IL1, a second conductive layer TS-CL2, and a second insulating layer TS-IL2. The first conductive layer TS-CL1 may be directly disposed on the encapsulation layer TFE. However, the inventive concepts are not limited thereto, and in some exemplary embodiments, another inorganic layer (for example, a buffer layer) may be further disposed between the first conductive layer TS-CL1 and the encapsulation layer TFE.

Each of the first conductive layer TS-CL1 and the second conductive layer TS-CL2 may have a single layer structure or a multilayer structure stacked in a third direction DR3. The conductive layer of the multilayer structure may include at least two layers of transparent conductive layers and metal layers. The conductive layer of the multilayer structure may include metal layers including different metals. The transparent conductive layer may include indium tin oxide (ITO), indium zinc oxide (IZO), zinc oxide (ZnO), indium tin zinc oxide (ITZO), PEDOT, a metal nanowire, and graphene. The metal layer may include molybdenum, silver, titanium, copper, aluminum, and an alloy thereof.

Each of the first conductive layer TS-CL1 and the second conductive layer TS-CL2 includes a plurality of patterns. The first conductive layer TS-CL1 includes first conductive patterns, and the second conductive layer TS-CL2 includes second conductive patterns. Each of the first conductive patterns and the second conductive patterns may include a touch electrode and touch signal lines.

Each of the first insulating layer TS-IL1 and the second insulating layer TS-IL2 may include an inorganic material or an organic material. The inorganic material may include at least one of aluminum oxide, titanium oxide, silicon oxide, silicon nitride, silicon oxynitride, zirconium oxide, and hafnium oxide. The organic material may include at least one of acrylic resin, methacrylic resin, polyisoprene, vinyl resin, epoxy resin, urethane resin, cellulose resin, siloxane resin, polyimide resin, polyamide resin, and perylene resin.

Each of the first insulating layer TS-IL1 and the second insulating layer TS-IL2 may have a single layer or multilayer structure. Each of the first insulating layer TS-IL1 and the second insulating layer TS-IL2 may have at least one of an inorganic layer and an organic layer. The inorganic layer and the organic layer may be formed by a chemical vapor deposition manner. Meanwhile, a stack structure of the touch sensing unit is not limited to that shown in FIG. 6. For example, in some exemplary embodiments, the second insulating layer TS-IL2 of the touch sensing unit may be omitted.

The first insulating layer TS-IL1 may insulate the first conductive layer TS-CL1 and the second conductive layer TS-CL2 from each other, and a shape thereof is not limited. The shape of the first insulating layer TS-IL1 may be changed according to shapes of the first conductive patterns and the second conductive patterns. The first insulating layer TS-IL1 may entirely cover the encapsulation layer TFE or may include a plurality of insulating patterns. The plurality of insulating patterns may overlap first connection portions CP1 or second connection portions CP2, which will be described later.

In the illustrated exemplary embodiment, two-layer type touch sensing unit is exemplarily shown, but the inventive concepts are not limited thereto. In some exemplary embodiments, the touch sensing unit may be formed as a single layer type including a conductive layer and an insulating layer covering the conductive layer. The conductive layer includes touch sensors and wire portions connected to the touch sensors. The single layer type touch sensing unit may obtain coordinate information by a self-capacitive manner.

Figure 7:
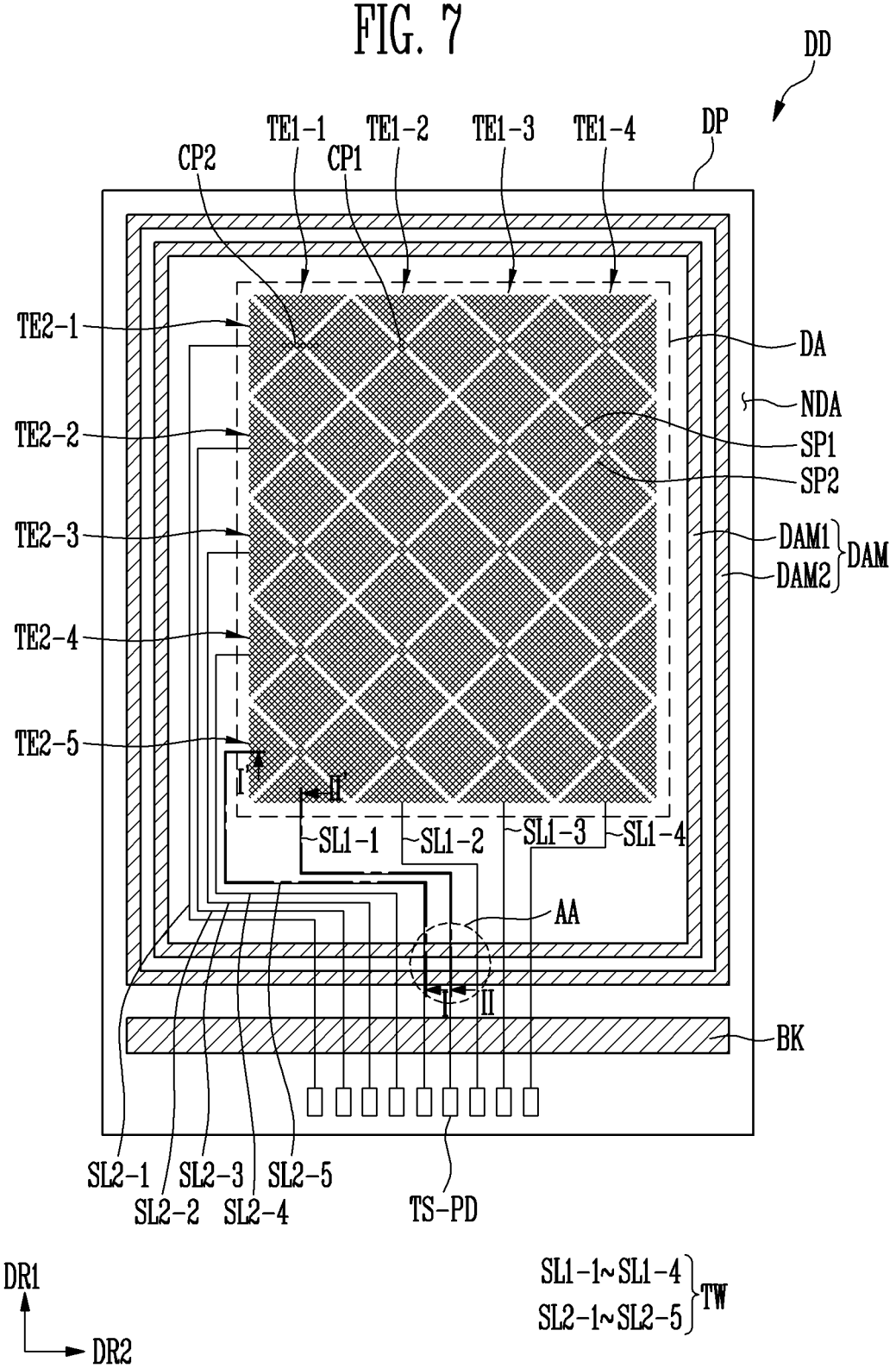
FIG. 7 is a plan view of the display device according to an exemplary embodiment.
Figure 8:
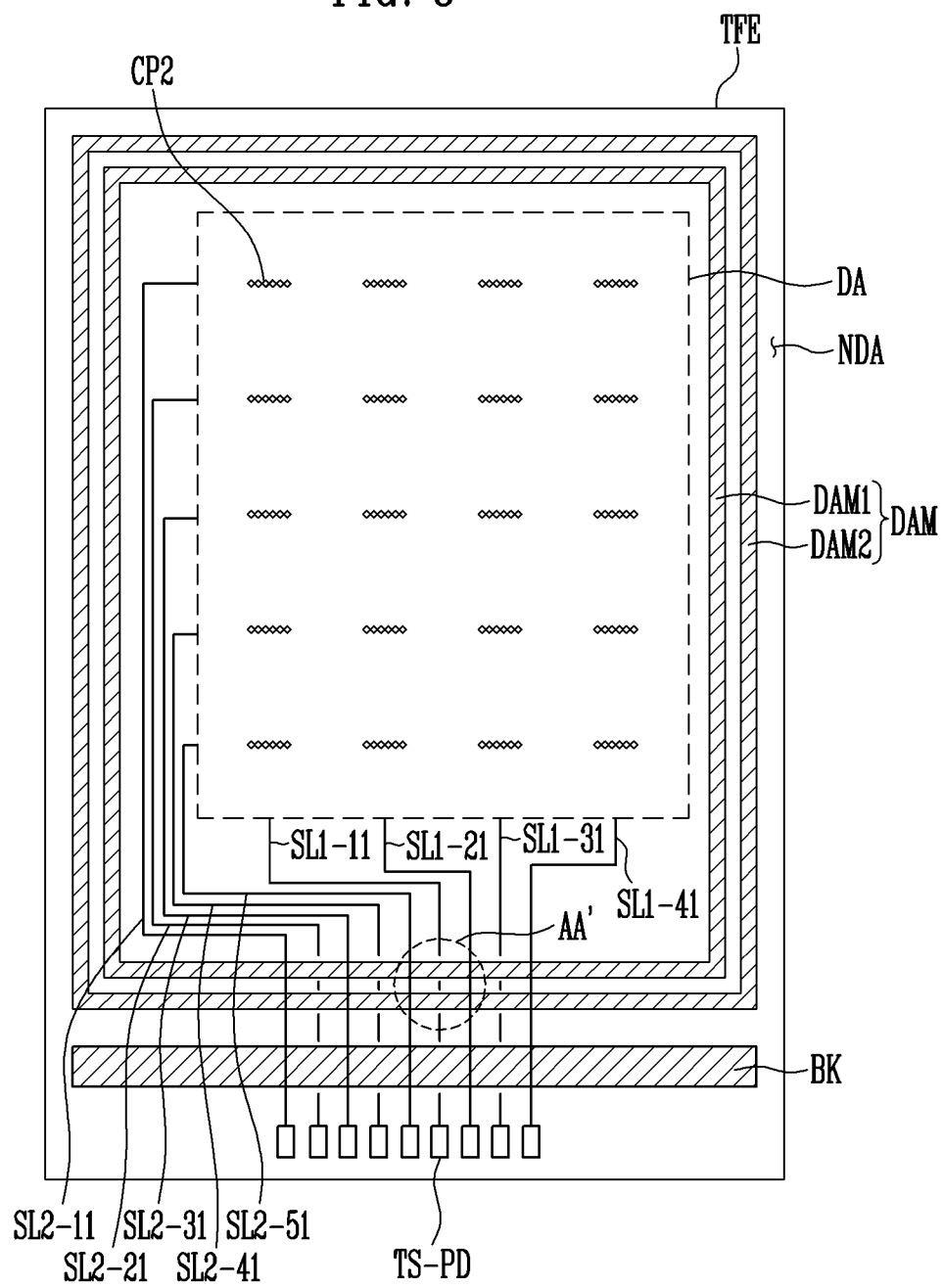
FIGS. 8, 9, and 10 are plan views of the touch sensing unit according to an exemplary embodiment.
Figure 9:
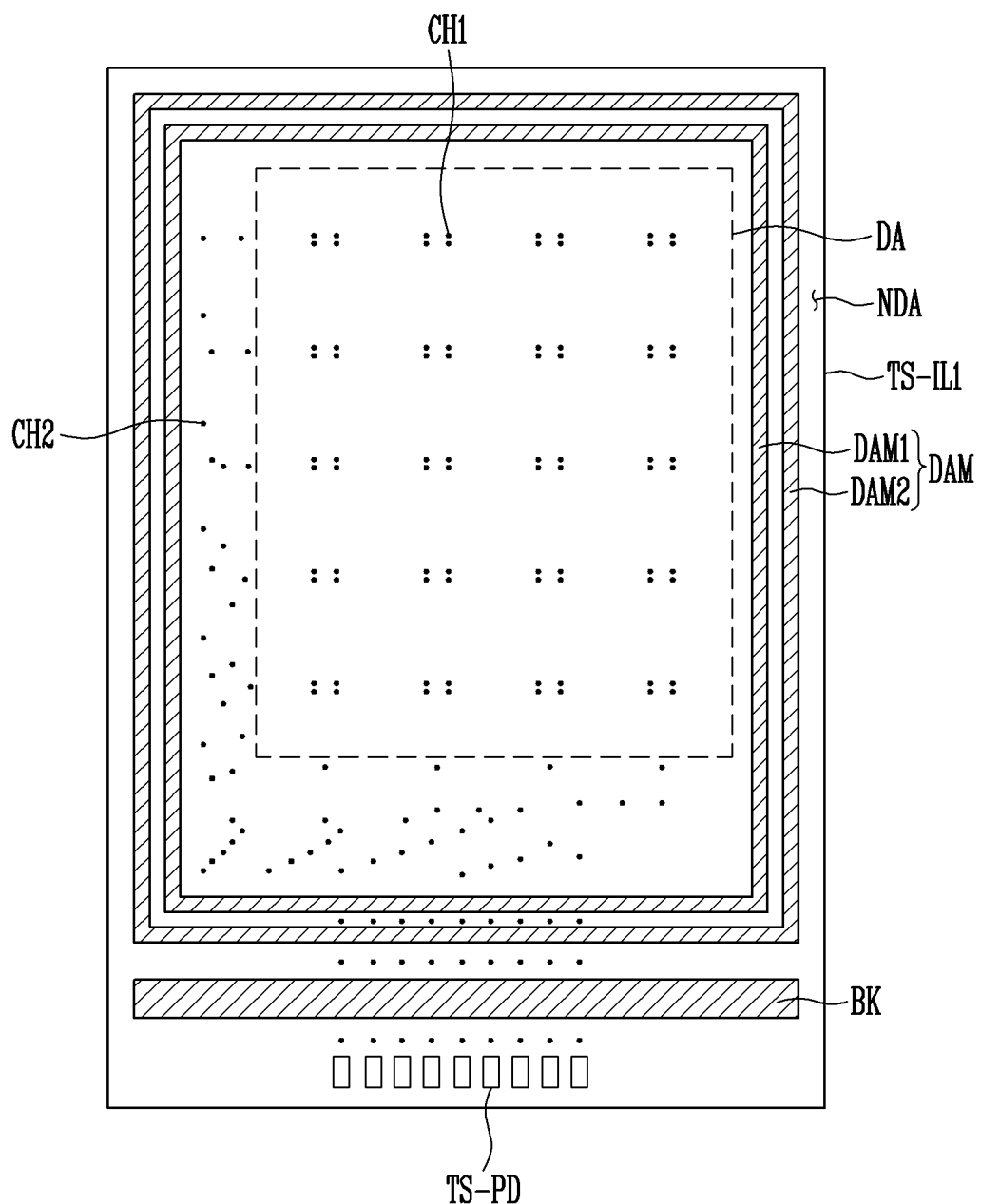
Figure 10:
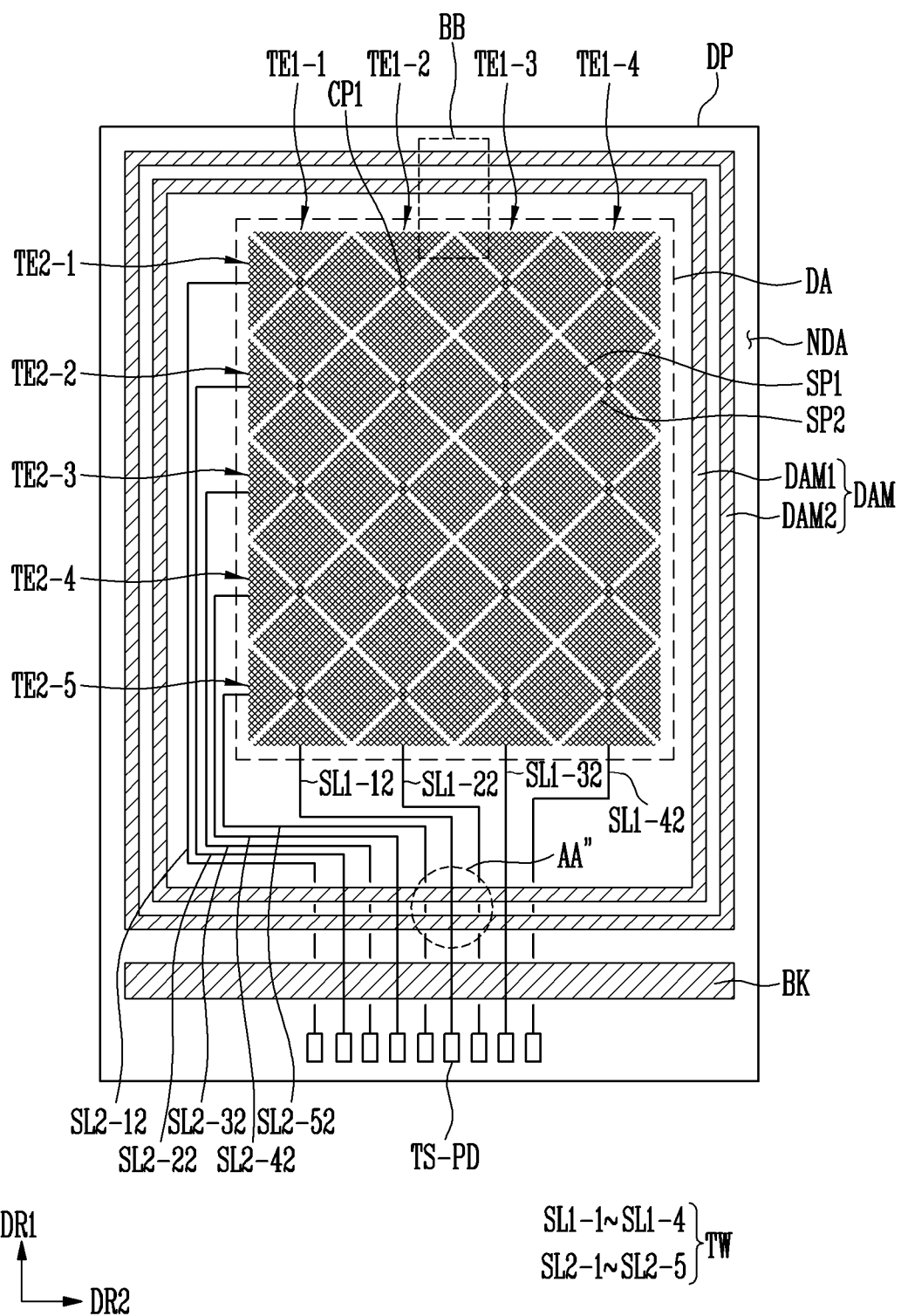

FIG. 7 is a plan view of the display device according to an exemplary embodiment. FIGS. 8 to 10 are plan views of the touch sensing unit according to exemplary embodiments.

Referring to FIGS. 4 and 7, the display device DD of an exemplary embodiment may include the base substrate SUB, the circuit layer DP-CL, the light emitting element layer DP-OLED, the encapsulation layer TFE, the touch sensing unit TS disposed on the encapsulation layer TFE, and a protrusion member DAM. The organic light emitting display panel DP may include the base substrate SUB, the circuit layer DP-CL, the light emitting element layer DP-OLED, and the encapsulation layer TFE. The display device DD according to an exemplary embodiment may include the organic light emitting display panel DP, the touch sensing unit TS, and the protrusion member DAM.

The organic light emitting display panel DP according to the illustrated exemplary embodiment may be substantially the same as that shown in FIG. 4. The display device DD according to an exemplary embodiment may include the base substrate SUB divided into the display area DA and the non-display area NDA. The display device DD may include the circuit layer DP-CL disposed on the base substrate SUB, and the light emitting element layer DP-OLED disposed on the display area DA of the base substrate SUB. The encapsulation layer TFE may cover the light emitting element layer DP-OLED.

In addition, the protrusion member DAM may be disposed on the non-display area NDA of the base substrate SUB. At least one protrusion member DAM may be disposed in the non-display area NDA. For example, one protrusion member DAM may be disposed or two or more protrusion members DAM may be disposed in the non-display area NDA. In addition, when the protrusion member DAM is disposed in the non-display area NDA, one protrusion member DAM may be disposed in a portion of the non-display area NDA, and a plurality of protrusion members DAM may be disposed in the remaining portions. When a plurality of protrusion members DAM are disposed, the number of the protrusion members DAM disposed may vary according to a position of the non-display area NDA. In addition, the encapsulation layer TFE may be disposed to cover the protrusion member DAM and extend to the non-display area NDA of the base substrate SUB.

The encapsulation layer TFE covering the protrusion member DAM may include only inorganic thin films without organic thin films. However, the inventive concepts are not limited thereto, and in some exemplary embodiments, the encapsulation layer TFE may include both of the inorganic thin films and the organic thin films disposed between the inorganic thin films even in a portion covering the protrusion member DAM. In addition, when the plurality of protrusion members DAM are disposed, the encapsulation layer TFE surrounding a first protrusion member DAM1 that is closer to the display area DA may include organic thin films disposed between the inorganic thin films. Meanwhile, the encapsulation layer TFE surrounding a second protrusion member DAM2 disposed outside of the first protrusion member DAM1 may include only inorganic thin films.

The protrusion member DAM may be disposed on the non-display area NDA. The protrusion member DAM may be disposed outside the display area DA. The protrusion member DAM may be disposed to surround the display area DA. The protrusion member DAM may include the first protrusion member DAM1 disposed relatively adjacent to the display area DA and the second protrusion member DAM2 disposed outside the first protrusion member DAM1. The second protrusion member DAM2 may have a thickness greater than that of the first protrusion member DAM1 in the third direction DR3. For example, the first protrusion member DAM1 may prevent organic monomer from being formed by coating the organic thin films from flowing to the outside.

The protrusion member DAM may include a plurality of layers. For example, the first protrusion member DAM1 may include two stacked layers, and the second protrusion member DAM2 may include three stacked layers. The protrusion member DAM shown in FIG. 7 is illustrated as surrounding the entire display area DA, however, the inventive concepts are not limited thereto. For example, in some exemplary embodiments, the protrusion member DAM may be disposed to surround at least one side of the display area DA.

In some exemplary embodiments, the display device may further include a side surface protrusion member disposed on the non-display area NDA of the base substrate SUB. The side surface protrusion member may be disposed outside the second protrusion member DAM2. For example, the side surface protrusion member may be disposed to extend in the first direction DR1 at an outside of the second protrusion member DAM2. The side surface protrusion member may absorb an external impact, and thus, may prevent the impact from being transferred into the display area DA and suppress generation of a crack.

In addition, the display device may further include a bank portion BK disposed outside the second protrusion member DAM2 and disposed adjacent to a touch pad TS-PD. The bank portion BK may be a third protrusion member disposed outside the second protrusion member DAM2 and extending in the second direction DR2. The bank portion BK may function as a spacer, such that a mask used during a manufacturing process of the organic light emitting display panel DP and the touch sensing unit TS does not directly contact the elements of the organic light emitting display panel DP or the touch sensing unit TS. A thickness of the bank portion BK may be greater than a thickness of the first protrusion member DAM1 or the second protrusion member DAM2.

In some exemplary embodiments, the bank portion BK may be omitted. In addition, in some exemplary embodiments, any one of the side surface protrusion member and the bank portion may be omitted.

The touch sensing unit TS may be disposed on the encapsulation layer TFE. The touch sensing unit TS may include touch electrodes TE1-1 to TE1-4 and TE2-1 to TE2-5 and a wire portion TW. The touch electrodes TE1-1 to TE1-4 and TE2-1 to TE2-5 may be disposed on the encapsulation layer TFE of the display area DA. The wire portion TW may be connected to the touch electrodes TE1-1 to TE1-4 and TE2-1 to TE2-5, and may be disposed on the non-display area NDA. One region of the wire portion TW may be disposed on the protrusion member DAM. The wire portion TW may be disposed on the protrusion member DAM along a step difference of the protrusion member DAM. The wire portion TW may extend from the touch electrodes TE1-1 to TE1-4 and TE2-1 to TE2-5 to be connected to the touch pad TS-PD.

In the plan view of FIG. 7, the touch sensing unit TS may include first touch electrodes TE1-1 to TE1-4, first touch signal lines SL1-1 to SL1-4 connected to the first touch electrodes TE1-1 to TE1-4, second touch electrodes TE2-1 to TE2-5, and second touch signal lines SL2-1 to SL2-5 connected to the second touch electrodes TE2-1 to TE2-5.

The first touch signal lines SL1-1 to SL1-4 and the second touch signal lines SL2-1 to SL2-5 connect between the touch electrode TE and the touch pad TS-PD, and may form the wire portion TW.

Referring to FIGS. 8 to 10, the wire portion TW may have a double wire structure, in which first metal wires SL1-11 to SL1-41 and SL2-11 to SL2-51 and second metal wires SL1-12 to SL1-42 and SL2-12 to SL2-52 are stacked.

For example, the first touch signal lines SL1-1 to SL1-4 may include the first metal wires SL1-11 to SL1-41 and the second metal wires SL1-12 to SL1-42, and the second touch signal lines SL2-1 to SL2-5 may include the first metal wires SL2-11 to SL2-51 and the second metal wires SL2-12 to SL2-52. In addition, the wire portion TW may further include a first insulating layer TS-IL1 interposed between the first metal wires SL1-11 to SL1-41 and SL2-11 to SL2-51 and the second metal wires SL1-12 to SL1-42 and SL2-12 to SL2-52, and a plurality of second contact holes CH2 formed in the first insulating layer TS-IL1.

The first metal wires SL1-11 to SL1-41 and SL2-11 to SL2-51 may be disposed on the encapsulation layer TFE, and the first insulating layer TS-CL1 may be interposed between the first metal wires SL1-11 to SL1-41 and SL2-11 to SL2-51 and the second metal wires SL1-12 to SL1-42 and the SL2-12 to SL2-52.

In addition, the plurality of second contact holes CH2 may be disposed between the first metal wires SL1-11 to SL1-41 and SL2-11 to SL2-51 and the second metal wires SL1-12 to SL1-42 and SL2-12 to SL2-52. The second contact holes CH2 may electrically connect the first metal wires SL1-11 to SL1-41 and SL2-11 to SL2-51 and the second metal wires SL1-12 to SL1-42 and SL2-12 to SL2-52. The second contact hole CH2 may be formed to pass through the first insulating layer TS-IL1.

When the wire portion TW has the double wire structure, in which the first metal wires SL1-11 to SL1-41 and SL2-11 to SL2-51 and the second metal wires SL1-12 to SL1-42 and SL2-12 to SL2-52 are stacked, a resistance of the wire portion TW may be reduced.

The touch electrode TE may be any one of the first touch electrodes TE1-1 to TE1-4 or the second touch electrodes TE2-1 to TE2-5.

FIG. 7 exemplarily shows the touch sensing unit TS including the four first touch electrodes TE1-1 to TE1-4 and the five second touch electrodes TE2-1 to TE2-5, however, the inventive concepts are not limited thereto.

Each of the first touch electrodes TE1-1 to TE1-4 may have a mesh shape, in which a plurality of touch opening portions are defined. Each of the first touch electrodes TE1-1 to TE1-4 includes a plurality of first touch sensor portions SP1 and a plurality of first connection portions CP1. The first touch sensor portions SP1 are arranged along the first direction DR1. Each of the first connection portions CP1 connects two adjacent first touch sensor portions SP1 among the first touch sensor portions SP1.

The second touch electrodes TE2-1 to TE2-5 are insulated from and cross the first touch electrodes TE1-1 to TE1-4. Each of the second touch electrodes TE2-1 to TE2-5 may have a mesh shape, in which a plurality of touch opening portions are defined. Each of the second touch electrodes TE2-1 to TE2-5 includes a plurality of second touch sensor portions SP2 and a plurality of second connection portions CP2. The second touch sensor portions SP2 are arranged along the second direction DR2. Each of the second connection portions CP2 connects two adjacent second touch sensor portions SP2 among the second touch sensor portions SP2. The second touch signal lines SL2-1 to SL2-5 may also have a mesh shape.

The first touch electrodes TE1-1 to TE1-4 and the second touch electrodes TE2-1 to TE2-5 are electrostatically coupled to each other. As such, when touch sensing signals are applied to the first touch electrodes TE1-1 to TE1-4, capacitances are formed between the first touch sensor portions SP1 and the second touch sensor portions SP2.

Some of the plurality of first touch sensor portions SP1, the plurality of first connection portions CP1, the first touch signal lines SL1-1 to SL1-4, the plurality of second touch sensor portions SP2, the plurality of second connection portions CP2, and the second touch signal lines SL2-1 to SL2-5 may be formed by patterning the first conductive layer TS-CL1 shown in FIG. 8, and others may be formed by patterning the second conductive layer TS-CL2 shown in FIG. 8.

In order to electrically connect conductive patterns disposed on different layers, a plurality of first contact holes CH1 passing through the first insulating layer TS-IL1 may be formed as shown in FIG. 8. Hereinafter, the touch sensing unit TS according to an exemplary embodiment will be described with reference to FIGS. 8 to 10. In FIGS. 8 to 10, the first to third protrusion members DAM1, DAM2, and BK may be disposed in the non-display area NDA.

As shown in FIG. 8, first conductive patterns are disposed on the encapsulation layer TFE. The first conductive patterns may include bridge patterns CP2, the first metal wires SL1-11 to SL1-41 of the first touch signal lines SL1-1 to SL1-4, and the second metal wires SL2-11 to SL2-51 of the second touch signal lines SL2-1 to SL2-5. The bridge patterns CP2 may be directly disposed on the encapsulation layer TFE. The bridge patterns CP2 correspond to the second connection portions CP2 shown in FIG. 7.

As shown in FIG. 9, the first insulating layer TS-IL1 covering the bridge patterns CP2 is disposed on the encapsulation layer TFE. A plurality of second contact holes CH2 that partially expose the bridge patterns CP2, the first metal wires SL1-11 to SL1-41 of the first touch signal lines SL1-1 to SL1-4, and the second metal wires SL2-11 to SL2-51 of the second touch signal lines SL2-1 to SL2-5 may be formed in the first insulating layer TS-IL1. The second contact holes CH2 may be formed by a photolithography process, for example.

As shown in FIG. 10, second conductive patterns may be disposed on the first insulating layer TS-IL1. The second conductive patterns may include the plurality of first touch sensor portions SP1, the plurality of first connection portions CP1, the second metal wires SL1-12 to SL1-42 of the first touch signal lines SL1-1 to SL1-4, the plurality of second touch sensors SP2, and the second metal wires SL2-12 to SL2-52 of the second touch signal lines SL2-1 to SL2-5. In some exemplary embodiments, a second insulating layer TS-IL2 covering the second conductive patterns may be disposed on the first insulating layer TS-IL1.

According to an exemplary embodiment shown in FIGS. 7 to 10, the protrusion member DAM may be disposed in the non-display area NDA, and the first protrusion member DAM1 and the second protrusion member DAM2 may be disposed to surround the touch electrodes TE1-1 to TE1-4 and TE2-1 to TE2-5 disposed in the display area DA. In addition, the wire portion TW passes through only the protrusion member DAM adjacent to the touch pad TS-PD, but the inventive concepts are not limited thereto. In some exemplary embodiments, the wire portion TW may be disposed to pass not only a portion adjacent to the touch pad TS-PD but also another portion of the protrusion member DAM. For example, the second touch signal lines SL2-1 to SL2-5, which are wire portions TW, may be disposed to pass at least one of the first protrusion member DAM1 and the second protrusion member DAM2 extending in the first direction DR1. The bank portion BK may be disposed at an outer side of the second protrusion member DAM2 as the third protrusion member, and the wire portion TW may be connected to the touch pad TS-PD through the bank portion BK.

In some exemplary embodiments, the first conductive patterns and the second conductive patterns may be interchanged. In this case, the second conductive patterns may include the bridge patterns CP2.

As described above, when the wire portion TW is disposed on the non-display area NDA, the wire portion TW may be formed to have the double wire structure, in which the first metal wires SL1-11 to SL1-41 and SL2-11 to SL2-51 and the second metal wire SL1-12 to SL1-42 and SL2-12 to SL2-52 are stacked. However, when the wire portion TW is disposed on the protrusion member DAM, due to a step difference between the protrusion member DAM and the remaining area of the non-display area NDA, a short may occur between adjacent wires during a photolithography process. Accordingly, according to an exemplary embodiment, at least a portion of the wire portion TW disposed on the protrusion member DAM may be formed to have a single wire structure, in which only metal wires of any one of the first metal wires SL1-11 to SL1-41 and SL2-11 to SL2-51 and the second metal wires SL1-12 to SL1-42 and SL2-12 to SL2-52 are disposed. The wire portion TW disposed on the protrusion member DAM will be described in detail with reference to FIGS. 12 to 16.

FIG. 11 is a partially enlarged view of region BB of FIG. 10 according to an exemplary embodiment.

Referring to FIG. 11, the first touch sensor portion SP1 overlaps a non-light emission area NPXA. The first touch sensor portion SP1 includes a plurality of first extension portions SP1-A extending in a fifth direction DR5 crossing the first direction DR1 and the second direction DR2, and a plurality of second extension portions SP1-B extending in a sixth direction DR6 crossing the fifth direction DR5. The plurality of first extension portions SP1-A and the plurality of second extension portions SP1-B may be formed as a mesh line. A line width of the mesh line may be several micrometers.

The plurality of first extension portions SP1-A and the plurality of second extension portions SP1-B are connected to each other to form a plurality of touch opening portions TS-OP. In particular, the first touch sensor portion SP1 has a mesh shape having the plurality of touch opening portions TS-OP. Although the touch opening portions TS-OP is shown as corresponding to the emission areas PXA in one-to-one correspondence, however, the inventive concepts are not limited thereto. For example, in some exemplary embodiments, one touch opening portion TS-OP may correspond to two or more light emission areas PXA.

A size of the light emission area PXA may be various. For example, the sizes of the light emission areas PXA providing blue light and the light emission areas PXA providing red light may be different among the light emission areas PXA. In this manner, sizes of the touch opening portions TS-OP may also be various. FIG. 10 illustrates that the sizes of the light emission areas PXA are various, however, the inventive concepts are not limited thereto. For example, in some exemplary embodiments, the sizes of the light emission areas PXA may be the same, and the sizes of the touch opening portions TS-OP may also be the same.

Figure 12:
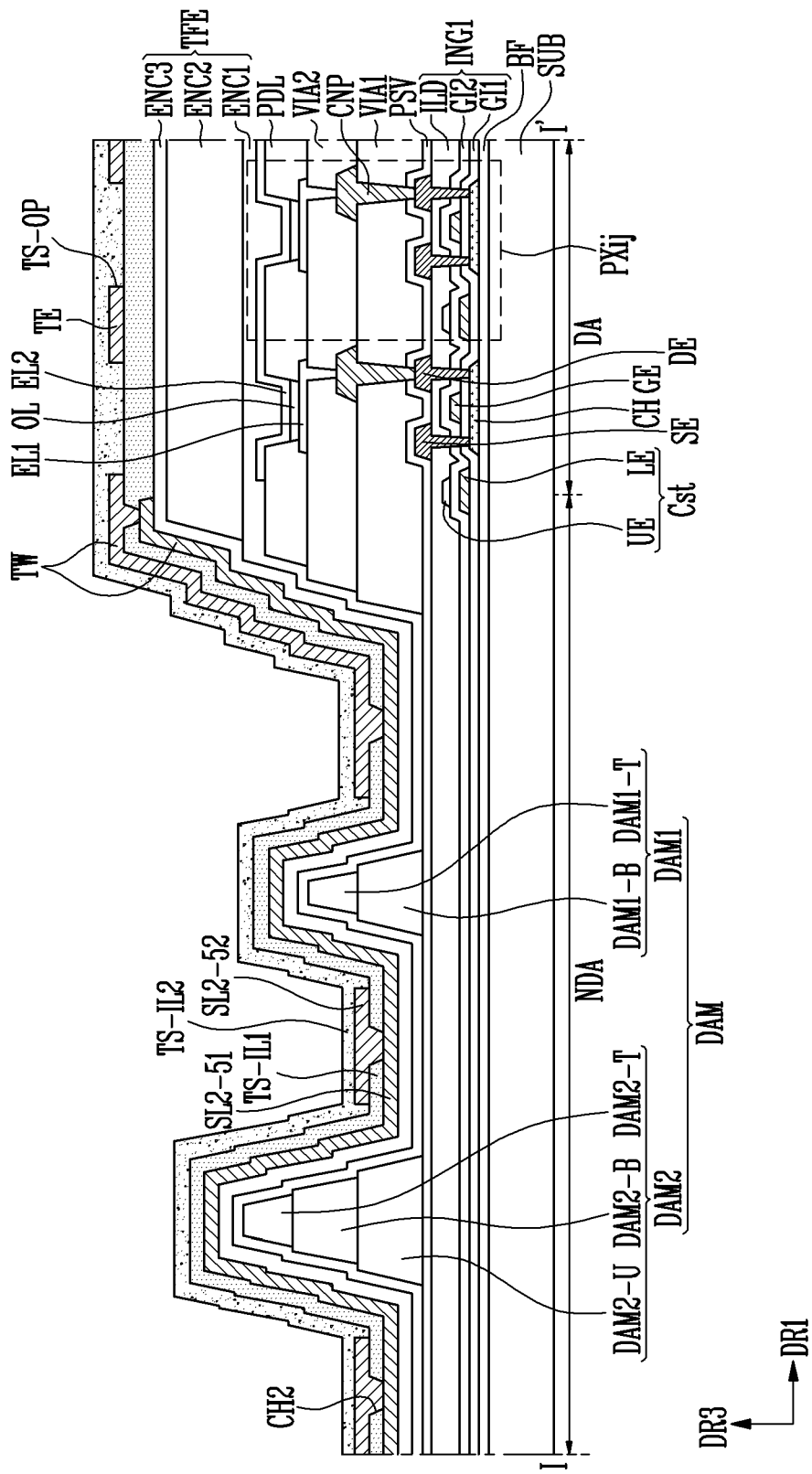
FIG. 12 is a cross-sectional view taken along line I-I' of FIG. 7 according to an exemplary embodiment.
Figure 13:
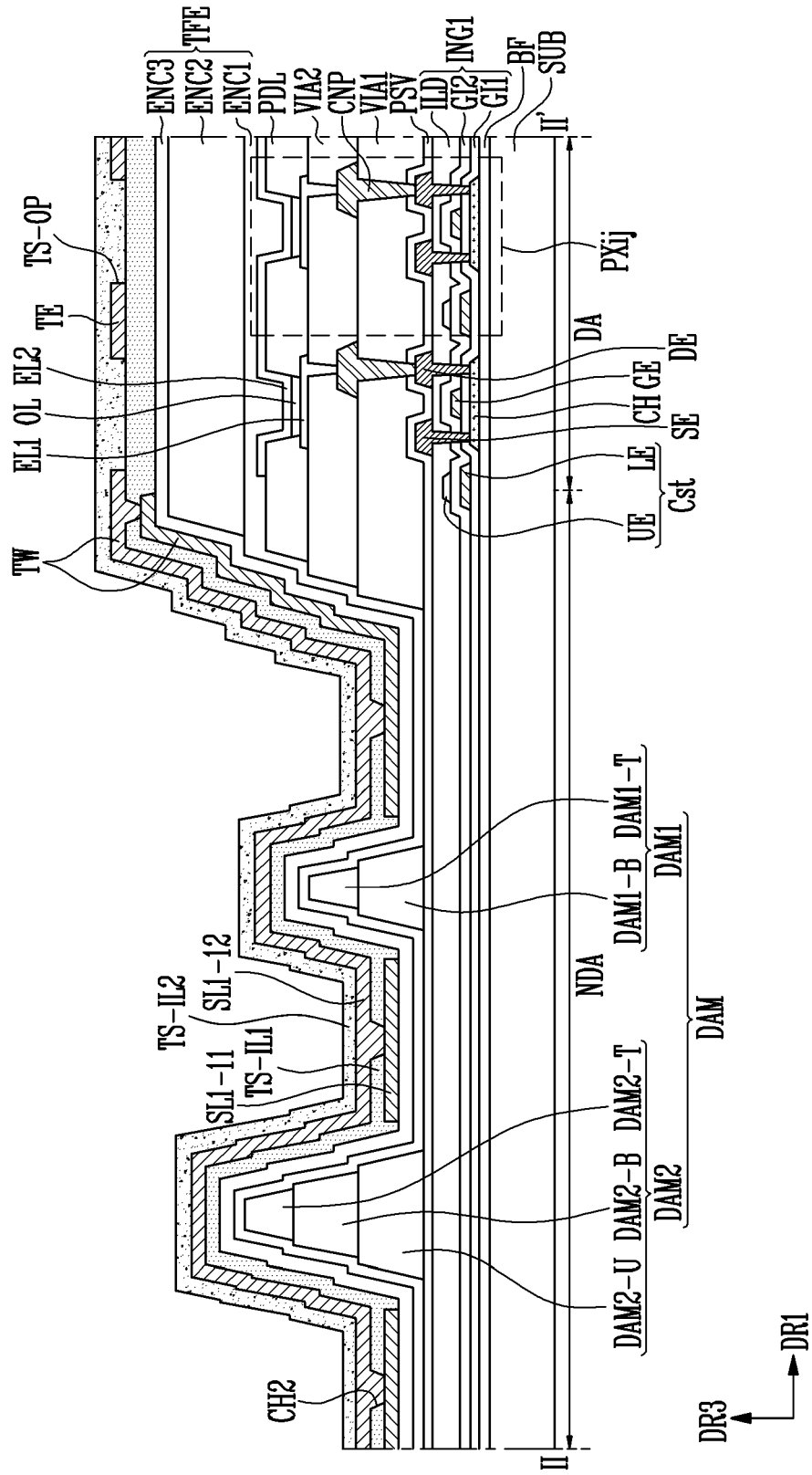
FIG. 13 is a cross-sectional view taken along line II-IF of FIG. 7 according to an exemplary embodiment.

FIG. 12 is a cross-sectional view taken along line I-I' of FIG. 7 according to an exemplary embodiment. FIG. 13 is a cross-sectional view taken along line II-IF of FIG. 7 according to an exemplary embodiment.

Referring to FIGS. 5, 12, and 13, pixels PXij are provided in the display area DA. Each pixel PXij may include a transistor connected to a corresponding wire among the data lines DL, a light emitting element connected to the transistor, and a capacitor Cst. The transistor may correspond to a driving transistor for controlling the light emitting element, a switching transistor for switching the driving transistor, or the like.

In the drawings, one transistor, one light emitting element, and one capacitor Cst are exemplarily illustrated with respect to one pixel PXij.

The base substrate SUB may be formed of an insulating material such as glass or resin. In addition, the base substrate SUB may be formed of a material having flexibility to be bent or folded, and may have a single layer structure or a multilayer structure.

A buffer film BF may cover the base substrate SUB. The buffer film BF may prevent an impurity from diffusing into a channel CH of the transistor. The buffer film BF may be an inorganic insulating film formed of an inorganic material. For example, the buffer film BF may be formed of silicon nitride, silicon oxide, silicon oxynitride, or the like. In some exemplary embodiments, the buffer film BF may be omitted according to a material and a process condition of the base substrate SUB. According to an exemplary embodiment, a barrier film (or a barrier layer) may be further provided.

An active film may be positioned on the buffer film BF. The active film may be doped and patterned to form the channel CH, a source region, and a drain region of the transistor, or may form a wire. The active film may be formed of a semiconductor material. The active film may be a semiconductor pattern formed of polysilicon, amorphous silicon, oxide semiconductor, or the like. The channel CH may be a semiconductor pattern that is not doped with an impurity, and may be an intrinsic semiconductor. The source region, the drain region, and the wire may be a semiconductor pattern doped with an impurity. As the impurity, an impurity such as an n-type impurity, a p-type impurity, and other metals may be used.

A first gate insulating film GI1 may cover the channel CH and other active films. The first gate insulating film GI1 may be an inorganic insulating film formed of an inorganic material. As the inorganic material, an inorganic insulating material such as polysiloxane, silicon nitride, silicon oxide, or silicon oxynitride may be used.

A gate electrode GE of the transistor and a capacitor lower electrode LE may be positioned on the first gate insulating film GI1. The gate electrode GE may overlap a region corresponding to the channel CH.

The gate electrode GE and the capacitor lower electrode LE may be formed of metal. For example, the gate electrode GE may be formed of at least one of metal, such as gold (Au), silver (Ag), aluminum (Al), molybdenum (Mo), chromium (Cr), titanium (Ti), nickel (Ni), neodymium (Nd), and copper (Cu), or an alloy thereof. In addition, the gate electrode GE may be formed as a single film, but is not limited thereto. In some exemplary embodiments, the gate electrode GE may be formed as multiple films in which two or more materials among metals and alloys are stacked.

A second gate insulating film GI2 may cover the gate electrode GE and the capacitor lower electrode LE. The second gate insulating film GI2 may be an inorganic insulating film formed of an inorganic material. As the inorganic material, polysiloxane, silicon nitride, silicon oxide, silicon oxynitride, and the like may be used.

A capacitor upper electrode UE may be positioned on the second gate insulating film GI2. The capacitor upper electrode UE may be formed of metal. For example, the capacitor upper electrode UE may be formed of at least one of metal, such as gold (Au), silver (Ag), aluminum (Al), molybdenum (Mo), chromium (Cr), titanium (Ti), nickel (Ni), neodymium (Nd), and copper (Cu), or an alloy thereof. In addition, the capacitor upper electrode UE may be formed as a single film, but is not limited thereto. The capacitor upper electrode UE may be formed as multiple films, in which two or more materials of metals and alloys are stacked.

The capacitor lower electrode LE and the capacitor upper electrode UE may form the capacitor Cst with the second gate insulating film GI2 interposed therebetween. In FIG. 5, the capacitor Cst is shown as having a two-layer electrode structure including the capacitor lower electrode LE and the capacitor upper electrode UE. However, in another exemplary embodiment, the capacitor Cst may be configured as a three-layer electrode structure using an active film, may be configured as a three-layer electrode structure using an electrode of the same layer as source/drain electrodes SE and DE, or may be configured as an electrode structure of four or more layers.

An interlayer insulating film ILD may cover the capacitor upper electrode UE. The interlayer insulating film ILD may be an inorganic insulating film formed of an inorganic material. As the inorganic material, polysiloxane, silicon nitride, silicon oxide, silicon oxynitride, and the like may be used.

The source electrode SE and the drain electrode DE of the transistor may be positioned on the interlayer insulating film ILD. The source electrode SE and the drain electrode DE may contact the source region and the drain region of the active film through contact holes formed in the interlayer insulating film ILD, the second gate insulating film GI2, and the first gate insulating film GI1, respectively.

The source electrode SE and the drain electrode DE may be formed of metal. For example, the source electrode SE and the drain electrode DE may be formed of at least one of metal, such as gold (Au), silver (Ag), aluminum (Al), molybdenum (Mo), chromium (Cr), titanium (Ti), and nickel (Ni), neodymium (Nd), copper (Cu), or an alloy thereof.

A passivation film PSV may cover the source electrode SE and the drain electrode DE of the transistor. The passivation film PSV may be an inorganic insulating film formed of an inorganic material. As the inorganic material, polysiloxane, silicon nitride, silicon oxide, silicon oxynitride, and the like may be used.

A first via film VIA1 may cover the passivation film PSV or the transistor. The first via film VIA1 may be an organic insulating film formed of an organic material. As the organic material, an organic insulating material such as a polyacrylic compound, a polyimide compound, a fluorocarbon compound such as Teflon®, or a benzocyclobutene compound may be used. The organic film may be deposited by an evaporation method, for example.

A connection pattern CNP may be connected to the source electrode SE or the drain electrode DE of the transistor through an opening portion of the first via film VIA1. The connection pattern CNP may be formed of at least one of metal, such as gold (Au), silver (Ag), aluminum (Al), molybdenum (Mo), chromium (Cr), titanium (Ti), nickel (Ni), neodymium (Nd), and copper (Cu), or an alloy thereof.

The second via film VIA2 may cover the first via film VIA1 and the connection pattern CNP. The second via film VIA2 may be an organic insulating film formed of an organic material. As the organic material, an organic insulating material such as a polyacrylic compound, a polyimide compound, a fluorocarbon compound such as Teflon®, or a benzocyclobutene compound may be used.

A first electrode EL1 may be connected to the connection pattern CNP through an opening portion of the second via film VIA2. Here, the first electrode EL1 may be an anode or a cathode of the light emitting element according to an exemplary embodiment.

In some exemplary embodiments, a configuration of the second via film VIA2 and the connection pattern CNP may be omitted, and the first electrode EL1 may be directly connected to the source electrode SE or the drain electrode DE of the transistor through the opening portion of the first via film VIA1. In some exemplary embodiments, the passivation film PSV may be omitted.

The first electrode EL1 may be formed of a metal film, such as Ag, Mg, Al, Pt, Pd, Au, Ni, Nd, Ir, Cr, or an alloy thereof, indium tin oxide (ITO), indium zinc oxide (IZO), zinc oxide (ZnO), indium tin zinc oxide (ITZO), and/or the like. The first electrode EL1 may be formed of one kind of metal, but is not limited thereto. The first electrode EL1 may be formed of an alloy of two or more kinds of metals, for example, Ag and Mg.

The first electrode EL1 may be formed of a transparent conductive film when providing an image in a lower direction of the base substrate SUB, and the first electrode EL1 may be formed of a metal reflective film and/or a transparent conductive film when providing an image in an upper direction of the base substrate SUB.

On the base substrate SUB on which the first electrode EL1 and the like are formed, a pixel definition film PDL is provided to partition the emission area of each pixel PXij. The pixel definition film PDL may be an organic insulating film formed of an organic material. As the organic material, an organic insulating material such as a polyacrylic compound, a polyimide compound, a fluorocarbon compound such as Teflon®, or a benzocyclobutene compound may be used.

The pixel definition film PDL may expose an upper surface of the first electrode EL1 and may protrude from the base substrate SUB along a circumference of the pixel PXij. An organic film OL may be provided in an area of the pixel PXij surrounded by the pixel definition film PDL.

The organic film OL may include a low molecular or high molecular material. The low molecular material may include copper phthalocyanine (CuPc), N,N-di(naphthalen-1-yl)-N, N'-diphenyl-benzidine(N,N'-Di (naphthalene-1-yl)-N, N'-diphenyl-benzidine (NPB), tris-8-hydroxyquinoline aluminum ($Alq_3$), and the like. Such materials may be formed by a method of vacuum deposition, for example. The high molecular material may include PEDOT, poly-phenylenevinylene (PPV), polyfluorene, and the like.

The organic film OL may be provided as a single layer, but in some exemplary embodiments, the organic film OL may be provided as a multilayer including various functional layers. When the organic film OL is provided as the multiple layers, the organic film OL may have a structure in which a hole injection layer (HIL), a hole transport layer (HTL), an emission layer (EML), an electron transport layer (ETL)), an electron injection layer (EIL), and the like are stacked in a single or complex structure. The organic film OL may be formed by a screen print or inkjet print method, a laser induced thermal imaging (LITI) method, or the like.

According to an exemplary embodiment, at least a portion of the organic film OL may be integrally formed over a plurality of first electrodes EL1, and may be individually provided to correspond to each of the plurality of first electrodes EL1.

A second electrode EL2 may be provided on the organic film OL. The second electrode EL2 may be provided for each pixel PXij, but in some exemplary embodiments, the second electrode EL2 may be provided to cover most of the display area DA and may be shared by a plurality of pixels PXij.

According to an exemplary embodiment, the second electrode EL2 may be used as a cathode or an anode. When the first electrode EL1 is an anode, the second electrode EL2 may be used as a cathode, and when the first electrode EL1 is a cathode, the second electrode EL2 may be used as an anode.

The second electrode EL2 may be formed of a metal film such as Ag, Mg, Al, Pt, Pd, Au, Ni, Nd, Ir, or Cr, a transparent conductive film such as indium tin oxide (ITO), indium zinc oxide (IZO), a zinc oxide (ZnO), or indium tin zinc oxide (ITZO), and/or the like. In an exemplary embodiment, the second electrode EL2 may be formed of multiple films of two or more films including a metal thin film. For example, the second electrode EL2 may be formed of triple films of ITO/Ag/ITO.

The second electrode EL2 may be formed of a metal reflective film and/or a transparent conductive film when providing an image in a lower direction of the base substrate SUB, and the second electrode EL2 may be formed of a transparent conductive film when providing an image in an upper direction of the base substrate SUB.

Hereinafter, a set of the first electrode EL1 the organic film OL, and the second electrode EL2 described above may be referred to as a light emitting element.

The encapsulation layer TFE may be provided on the second electrode EL2. The encapsulation layer TFE may be formed of a single layer, but may be formed of a multilayer. According to an exemplary embodiment, the encapsulation layer TFE may be formed of first to third encapsulation layers ENC1, ENC2, and ENC3. The first to third encapsulation layers ENC1, ENC2, and ENC3 may be formed of an organic material and/or an inorganic material. The outermost third encapsulation layer ENC3 may be formed of an inorganic material. For example, the first encapsulation layer ENC1 may be formed of an inorganic material, the second encapsulation layer ENC2 may be formed of an organic material, and the third encapsulation layer ENC3 may be formed of an inorganic material. Penetration of moisture or oxygen to the inorganic material is less than that to the organic material. However, the inorganic material is vulnerable to a crack due to its low elasticity or flexibility. Propagation of a crack may be prevented by forming the first encapsulation layer ENC1 and the third encapsulation layer ENC3 with the inorganic material and forming the second encapsulation layer ENC2 with the organic material. In this case, a layer formed of the organic material, that is, the second encapsulation layer ENC2, may be completely covered by the third encapsulation layer ENC3 so that an end portion is not exposed to the outside. As the organic material, an organic insulating material such as a polyacrylic compound, a polyimide compound, a fluorocarbon compound such as Teflon®, or a benzocyclobutene compound may be used. As the inorganic material, polysiloxane, silicon nitride, silicon oxide, silicon oxynitride, or the like may be used.

The organic film OL forming the light emitting element may be easily damaged by moisture or oxygen from the outside. The encapsulation layer TFE protects the organic film OL by covering the organic film OL. The encapsulation layer TFE covers the display area DA and may extend to the non-display area NDA outside the display area DA. When the insulating films are formed of an organic material, flexibility and elasticity may be improved, but moisture or oxygen may be easily penetrated as compared to an insulating film is formed of an inorganic material. As such, according to an exemplary embodiment, in order to prevent penetration of moisture or oxygen through insulating films formed of an organic material, an end portion of the insulating films formed of the organic material may be covered by insulating films formed of an inorganic material so as not to be exposed to the outside. For example, the first via film VIA1, the second via film VIA2, and the pixel definition film PDL, which are formed of an organic material, may not extend continuously to the non-display area NDA, but may be covered by the first encapsulation layer ENC1. In this manner, an upper surface of the pixel definition layer PDL and a side of the first via film VIA1, the second via film VIA2, and the pixel definition film PDL may be prevented from being exposed to the outside by being sealed by the encapsulation layer TFE including the inorganic material.

However, whether the encapsulation layer TFE is formed of a plurality of layers or a material of the encapsulation layer TFE are not limited thereto, and may be variously changed. For example, in some exemplary embodiments, the encapsulation layer TFE may include a plurality of organic material layers and a plurality of inorganic material layers which are alternately stacked.

The touch electrode TE may be positioned on the encapsulation layer TFE. According to an exemplary embodiment, an additional buffer film may be positioned between the touch electrode TE and the encapsulation layer TFE. The touch electrode TE may be formed of a metal film such as Ag, Mg, Al, Pt, Pd, Au, Ni, Nd, Ir or Cr, a transparent conductive film such as indium tin oxide (ITO), indium zinc oxide (IZO), zinc oxide (ZnO), indium tin zinc oxide (ITZO), and/or the like. According to an exemplary embodiment, when the touch electrode TE is formed of an opaque conductive film, the touch electrode TE may include the plurality of opening portions TS-OP that may expose the plurality of covered pixels PXij. For example, the touch electrode TE may be configured in a mesh shape. When the touch electrode TE is formed of a transparent conductive film, the touch electrode TE may be formed in a plate shape that does not include an opening portion. Hereinafter, the non-display area NDA will be described. In describing the non-display area NDA, in order to avoid redundancy, elements thereof already described above will be omitted or simply described.

According to an exemplary embodiment, the protrusion member DAM may have a multilayer structure.

For example, when viewed from a cross-section perpendicular to the base substrate SUB, the first protrusion member DAM1 may include a lower protrusion portion DAM1-B disposed on the base substrate SUB and an upper protrusion portion DAM1-T disposed on the lower protrusion portion DAM1-B. A cross-sectional of the lower protrusion portion DAM1-B and the upper protrusion portion DAM1-T may have substantially a trapezoidal shape. More particularly, each of the upper protrusion portion DAM1-T and the lower protrusion portion DAM1-B may have substantially a trapezoidal shape, in which a width of the protrusion portion gradually decreases from a bottom surface to an upper surface. As such, the area of the upper surface of the lower protrusion portion DAM1-B may be greater than the area of the bottom surface of the upper protrusion portion DAM1-T.

When viewed from a cross-section perpendicular to the base substrate SUB, the second protrusion member DAM2 may include a base protrusion portion DAM2-U, a second lower protrusion portion DAM2-B, and a second upper protrusion portion DAM2-T disposed on the base substrate SUB. A cross-sectional of the base protrusion portion DAM2-U, the second lower protrusion portion DAM2-B, and the second upper protrusion portion DAM2-T may have substantially a trapezoidal shape. More particularly, each of the base protrusion portion DAM2-U, the second lower protrusion portion DAM2-B, and the second upper protrusion portion DAM2-T may have substantially a trapezoidal shape, in which a width of the protrusion portion gradually decreases from a bottom surface to an upper surface. As such, the area of the upper surface of the base protrusion portion DAM2-U may be greater than the area of the bottom surface of the lower protrusion portion DAM1-B, and the area of the upper surface of the lower protrusion portion DAM1-B may be greater than the area of the bottom surface of the upper protrusion portion DAM1-T.

The lower protrusion portion DAM1-B, the upper protrusion portion DAM1-T, the base protrusion portion DAM2-U, the second lower protrusion portion DAM2-B, and the second upper protrusion portion DAM2-T may be formed of an organic material. Each of the lower protrusion portion DAM1-B, the upper protrusion portion DAM1-T, the base protrusion portion DAM2-U, the second lower protrusion portion DAM2-B, and the second upper protrusion portion DAM2-T may correspond to any one of the first via film VIA1, the second via film VIA2, and the pixel definition layer PDL. For example, when the lower protrusion portion DAM1-B and the base protrusion portion DAM2-U include the same material and are formed through the same process as the first via film VIA1, the upper protrusion portion DAM1-T and the second lower protrusion portion DAM2-B may include the same material and be formed through the same process as the second via film VIA2, and the second upper protrusion portion DAM2-T may include the same material and be formed through the same process as the pixel definition layer PDL.

According to an exemplary embodiment, in the non-display area NDA including the protrusion member DAM, the encapsulation layer TFE may include only the first and third encapsulation layers ENC1 and ENC3 formed of an inorganic material.

Referring to FIGS. 6, 7, 12, and 13, the wire portion TW may include the first conductive layer TS-CL1, the first insulating layer TS-IL1 disposed on the first conductive layer TS-CL1, the second conductive layer TS-CL2 disposed on the first insulating layer TS-IL1, and the plurality of second contact holes CH2 disposed between the first conductive layer TS-CL1 and the second conductive layer TS-CL2.

In FIG. 12, the wire portion TW is exemplarily illustrated as a second touch signal line SL2-5. The second touch signal line SL2-5 may include a first metal wire SL2-51 formed of the first conductive layer TS-CL1, a second metal wire SL2-52 formed of the second conductive layer TS-CL2, the second contact holes CH2 formed on the first insulating layer TS-IL1 and electrically connecting the first metal wire SL2-51 and the second metal wire SL2-52 to each other.

The first metal wire SL2-51 of the second touch signal line SL2-5 may be continuously extended without disconnection along the first direction DR1 on the non-display area NDA including the protrusion member DAM. The first insulating layer TS-IL1 may be disposed on the first metal wire SL2-51 of the second touch signal line SL2-5. The second metal wire SL2-52 of the second touch signal line SL2-5 may be disposed on the first insulating layer TS-IL1.

The second metal wire SL2-52 of the second touch signal line SL2-5 may be continuously extended without disconnection along the first direction DR1 on the non-display area NDA except for the protrusion member DAM. More particularly, the second metal wire SL2-52 of the second touch signal line SL2-5 may not be disposed on the protrusion member DAM. The second insulating layer TS-IL2 may be disposed on the second metal wire SL2-52 of the second touch signal line SL2-5.

In FIG. 13, the wire portion TW is exemplarily illustrated as a first touch signal line SL1-1. The first touch signal line SL1-1 may include a first metal wire SL1-11 formed of the first conductive layer TS-CL1, a second metal wire SL1-12 formed of the second conductive layer TS-CL2, and the second contact holes formed on the first insulating layer TS-IL1 and electrically connecting the first metal wire SL1-11 and the second metal wire SL1-12 to each other.

The first metal wire SL1-12 of the first touch signal line SL1-1 may be continuously extended without disconnection along the first direction DR1 on the non-display area NDA except for the protrusion member DAM. In particular, the first metal wire SL1-11 of the first touch signal line SL1-1 may not be disposed on the protrusion member DAM. The first insulating layer TS-IL1 may be disposed on the first metal wire SL1-11 of the first touch signal line SL1-1. The second metal wire SL1-12 of the first touch signal line SL1-1 may be disposed on the first insulating layer TS-IL1.

The second metal wire SL1-12 of the first touch signal line SL1-1 may be continuously extended without disconnection along the first direction DR1 on the non-display area NDA including the protrusion member DAM. The second insulating layer TS-IL2 may be disposed on the second metal wire SL1-12 of the first touch signal line SL1-1.

Each of the second contact holes CH2 is shown as being formed between the display area DA and the first protrusion member DAM1, between the first protrusion member DAM1 and the second protrusion member DAM2, and a neighboring area that does not overlap the second protrusion member DAM2. However, the inventive concepts are not limited thereto, and the number of second contact holes CH2 may be increased or decreased for electrical connection between the first metal wires SL1-11 and SL2-51 and the second metal wires SL1-12 and SL2-52 of the first touch signal line SL1-1 and the second touch signal line SL2-5.

Figure 14:
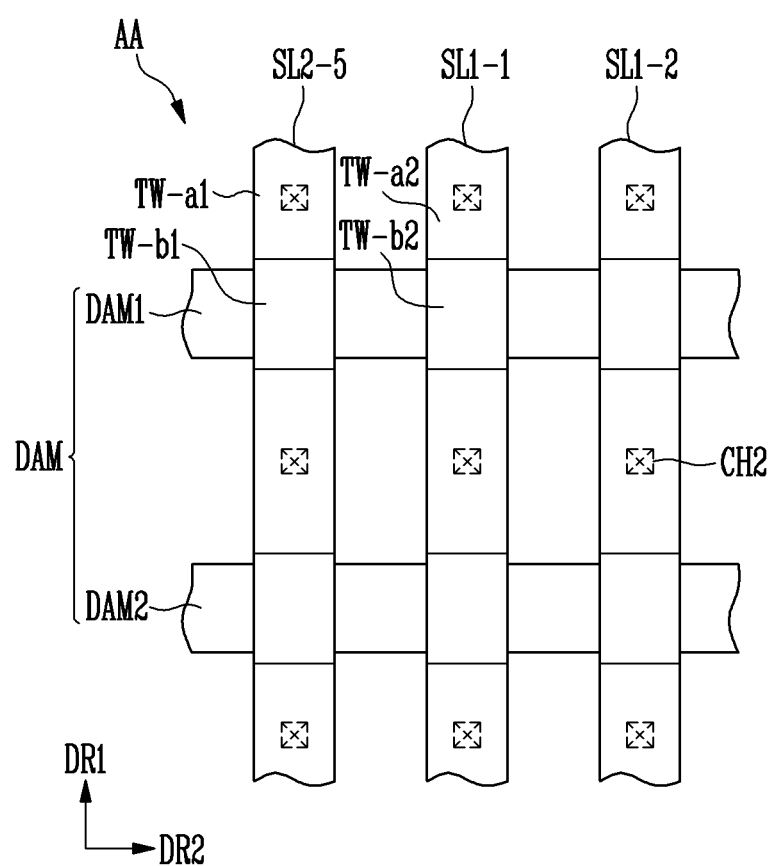
FIG. 14 is an enlarged view of region AA of FIG. 7 according to an exemplary embodiment.
Figure 15:
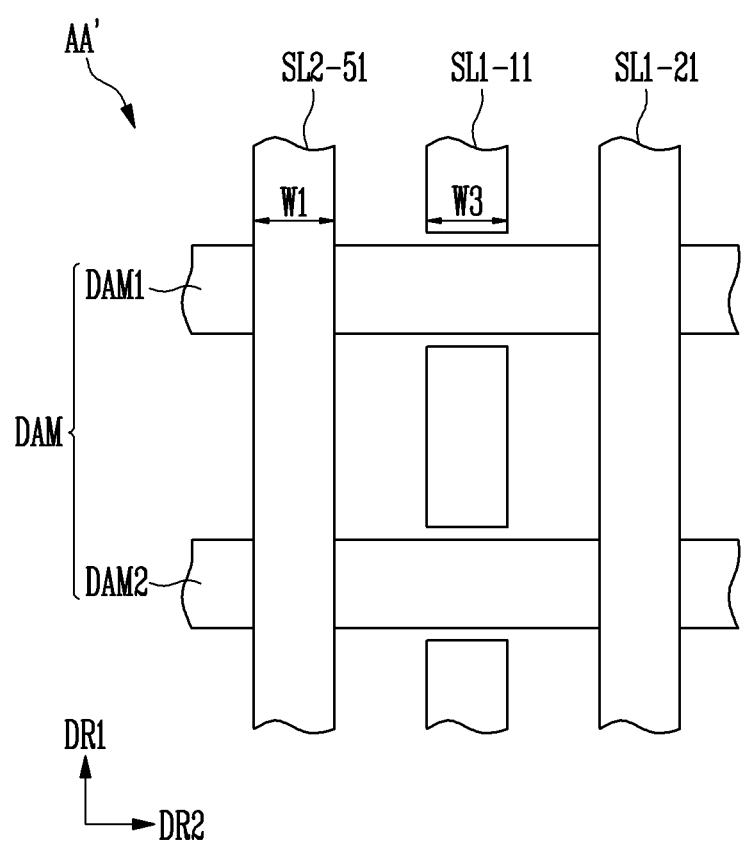
FIG. 15 is an enlarged view of region AA' of FIG. 8 according to an exemplary embodiment.
Figure 16:
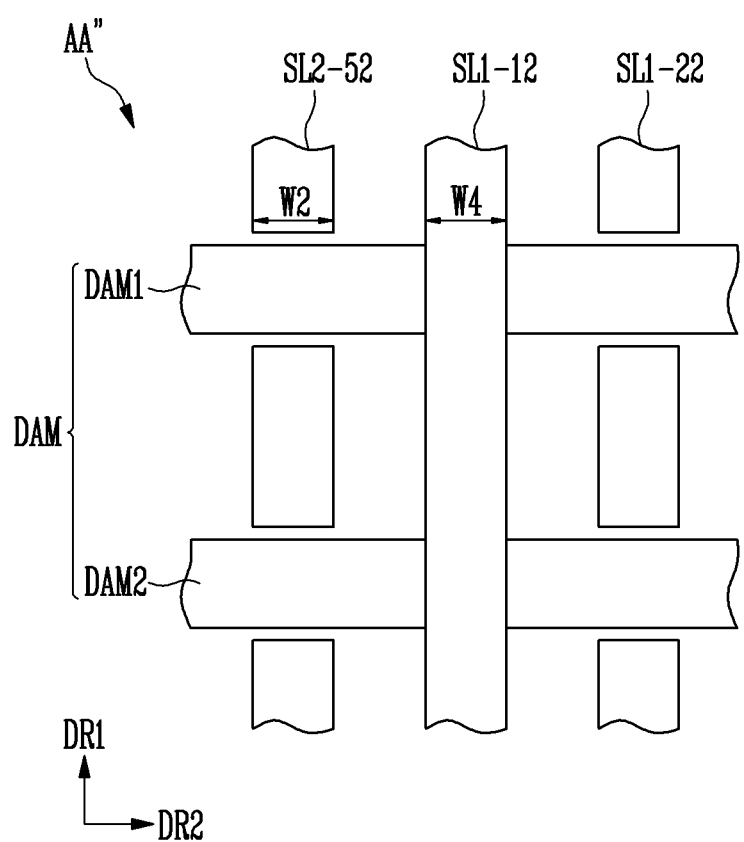
FIG. 16 is an enlarged view of region AA" of FIG. 10 according to an exemplary embodiment.

FIG. 14 is an enlarged view of region AA of FIG. 7 according to an exemplary embodiment. FIG. 15 is an enlarged view of region AA' region of FIG. 8 according to an exemplary embodiment. FIG. 16 is an enlarged view of region AA" of FIG. 10 according to an exemplary embodiment.

In FIGS. 14 to 16, the wire portion TW is exemplarily illustrated as including the first touch signal lines SL1-1 and SL1-2 and the second touch signal line SL2-5. The first touch signal lines SL1-1 and SL1-2 and the second touch signal lines SL2-5 may be extended along the first direction DR1, and may be disposed adjacent to each other along the second direction DR2. The protrusion members DAM may be extended along the second direction DR2, and may be disposed adjacent to each other the first direction DR1.

Hereinafter, the wire portion TW will be described with reference to the first touch signal line SL1-1 and the second touch signal line SL2-5.

According to an exemplary embodiment, the second touch signal line SL2-5 may include a first area TW-a1 that does not overlap the protrusion member DAM, and a second area TW-b1 that overlaps the protrusion member DAM. However, a portion of the second area TW-b1 may not overlap the protrusion member DAM for a process margin.

The first metal wire SL2-51 and the second metal wire SL2-52 may be disposed in the first area TW-a1 of the second touch signal line SL2-5. Only the first metal wire SL2-51 may be disposed in the second area TW-b1 of the second touch signal line SL2-5.

The first metal wire SL2-51 of the second touch signal line SL2-5 may have a first width W1 in the second direction DR2 and the second metal wire SL2-52 of the second touch signal line SL2-5 may have a second width W2 in the second direction DR2. The first width W1 and the second width W2 may be substantially equal to each other.

The plurality of second contact holes CH2 may be disposed in the first area TW-a1 of the first metal wire SL2-51 and the second metal wire SL2-52 of the second touch signal line SL2-5, and the second contact hole CH2 may not be disposed in the second area TW-b1.

The first touch signal line SL1-1 may include a first area TW-a2 that does not overlap the protrusion member DAM, and a second area TW-b2 that overlaps the protrusion member DAM. The first metal wire SL1-11 and the second metal wire SL1-12 may be disposed in the first area TW-a2 of the first touch signal line SL1-1. Only the second metal wire SL1-12 may be disposed in the second area TW-b2 of the first touch signal line SL1-1.

The first metal wire SL1-11 of the first touch signal line SL1-1 may have a first width W3 in the second direction DR2, and the second metal wire SL1-12 of the first touch signal line SL1-1 may have a second width W4 in the second direction DR2. The first width W3 and the second width W4 may be substantially equal to each other.

The plurality of second contact holes CH2 may be disposed in the first area TW-a2 of the first metal wire SL1-11 and the second metal wire SL1-12 of the first touch signal line SL1-1, and the second contact hole CH2 may not be disposed in the second area TW-b2.

Referring to FIGS. 6, 7 and 14 to 16, in the wire portion TW, a signal line having the same stack structure as the first touch signal line SL1-1 and a signal line having the same stack structure as the second touch signal line SL2-5 may be alternately disposed along the extension direction of the protrusion member DAM.

For example, the first touch signal line SL1-3 and the second touch signal lines SL2-2 and SL2-4 may have the same stack structure as the first touch signal line SL1-1, and the first touch signal lines SL1-2 and SL1-4 and the second touch signal lines SL2-1 and SL2-3 may have the same stack structure as the second touch signal line SL2-5.

The display device DD according to an exemplary embodiment may have the structure of the wire portion TW described above to prevent or at least suppress short defect between the wire portions TW.

When providing a photoresist material for patterning the wire portion TW, a stack height of the photoresist material may be increased at a portion where a step difference of the protrusion member DAM occurs. As such, patterning quality at a boundary portion of the wire portion TW may be degraded when etching the first and second conductive layers TS-CL1 and TS-CL2. In this case, a distance between the adjacent wire portions TW may become close, which may cause a short at least in a portion of the wire portion TW. However, according to an exemplary embodiment, since the plurality of touch signal lines SL1 and SL2 adjacent to each other are extended using different conductive layers on the protrusion member DAM, the wire portion TW may be insulated by the insulating layer. As such, the occurrence of a short defect between the wire portions TW adjacent to each other may be prevented.

Hereinafter, other exemplary embodiments will be described. In the following exemplary embodiments, the configuration of the elements already described above will be omitted or simplified, and the differences will be mainly described.

Figure 17:
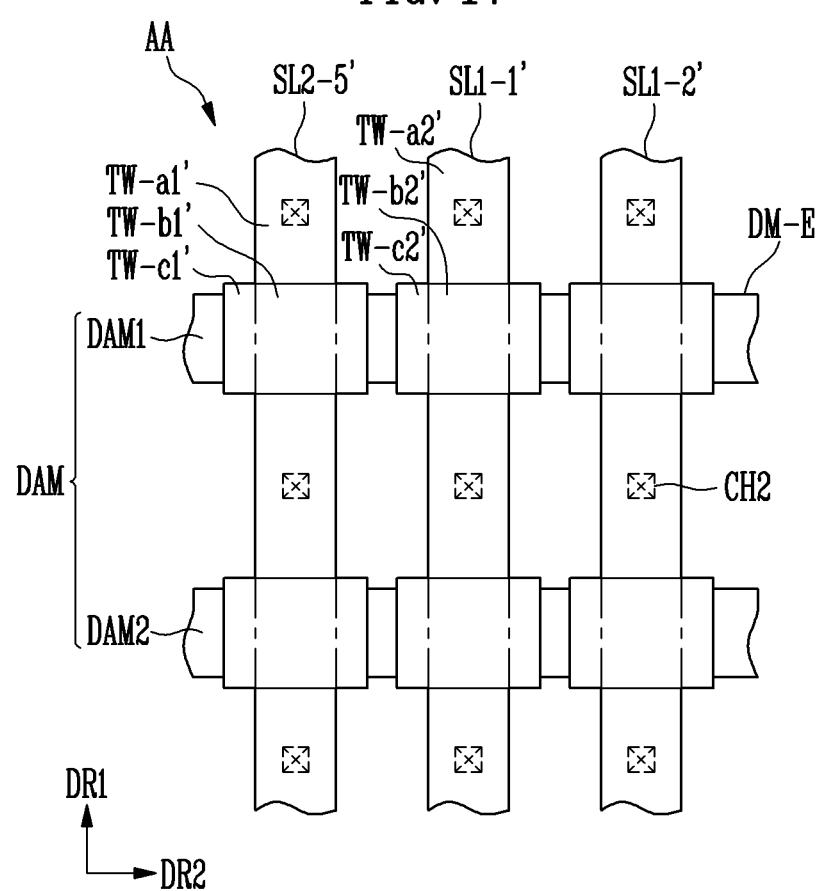
FIG. 17 is an enlarged view of region AA of FIG. 7 according to another exemplary embodiment.
Figure 18:
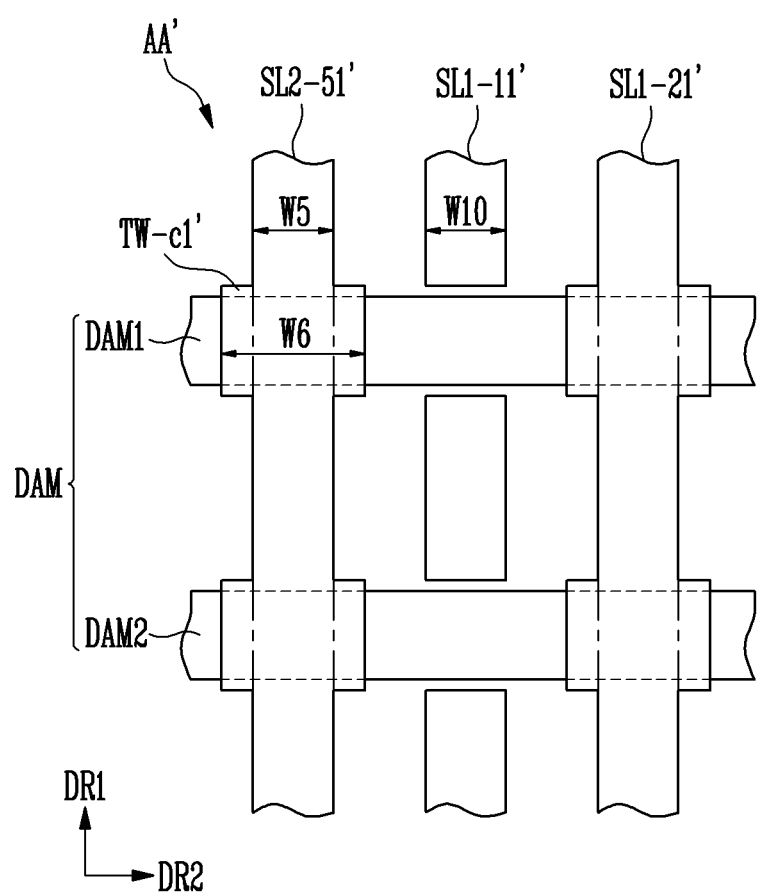
FIG. 18 is an enlarged view of region AA' of FIG. 8 according to another exemplary embodiment.
Figure 19:
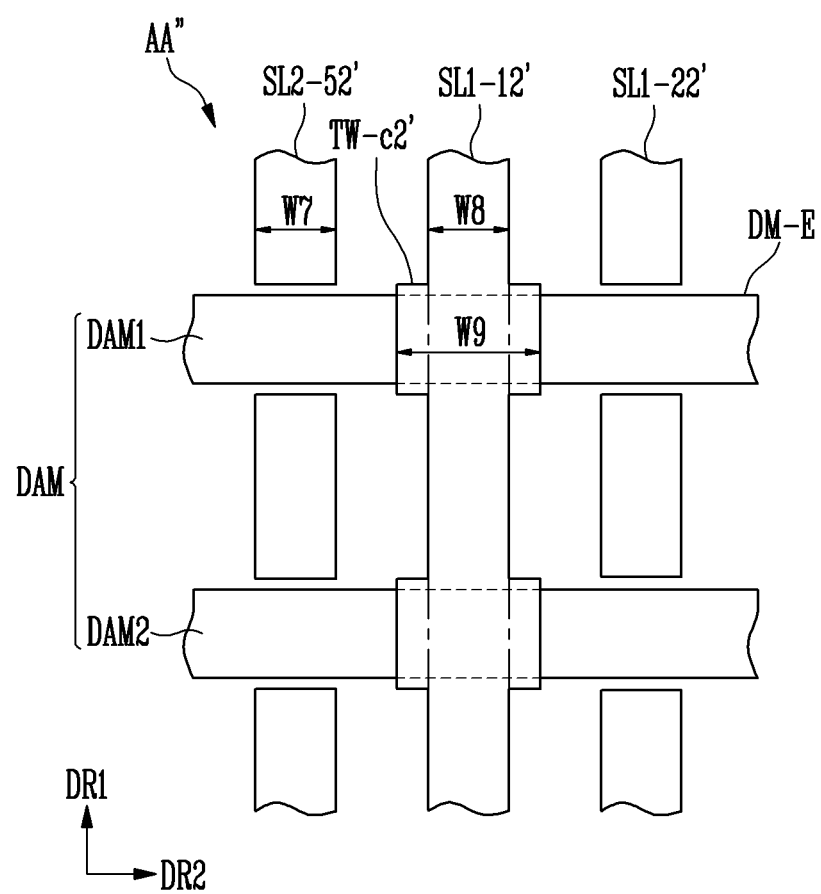
FIG. 19 is an enlarged view of region AA" of FIG. 10 according to another exemplary embodiment.

FIG. 17 is an enlarged view of region AA of FIG. 7 according to an exemplary embodiment. FIG. 18 is an enlarged view of region AA' of FIG. 8 according to an exemplary embodiment. FIG. 19 is an enlarged view of region AA'' of FIG. 10 according to an exemplary embodiment.

Referring to FIGS. 17 to 19, the wire portion according to the illustrated exemplary embodiment is different from that shown in FIGS. 14 to 16, in that the wire portion TW further includes a third area TW-c1'.

More specifically, a second touch signal line SL2-5' may include a first area TW-a1' that does not overlap the protrusion member DAM and a second area TW-b1' that overlaps the protrusion member DAM. However, a portion of the second area TW-b1' may not overlap the protrusion member DAM for a process margin.

The second touch signal line SL2-5' may further include the third area TW-c1' protruded from the second area TW-b1'. The third area TW-c1' may be disposed to overlap the protrusion member DAM. However, a portion of the third area TW-c1' may not overlap the protrusion member DAM for the process margin.

According to an exemplary embodiment, a length of the third area TW-c1' in the first direction DR1 may be substantially equal to a length of the second area TW-b1' in the first direction DR1, and a width of the third area TW-c1' in the second direction DR2 may be less than half of the shortest distance between adjacent touch signal lines SL2-5' and SL1-1'. In particular, the third area TW-c1' of the second touch signal line SL2-5' and a third area TW-c2' of the first touch signal line SL1-1' may not overlap on a plane.

The third area TW-c1' may have substantially a quadrangular shape on a plane. However, the planar shape of the third area TW-c1' is not limited thereto, and may have various shapes as long as the third area TW-c1' does not overlap a third area of an adjacent touch signal line. For example, the third area TW-c1' may have a polygon shape including a rhombus shape and an elliptical shape including a semicircle shape on a plane.

The second touch signal line SL2-5' may be disposed so that a first metal wire SL2-51' and a second metal wire SL2-52' overlap in the first area TW-a1'. Only the first metal wire SL2-51' may be disposed in the second area TW-b1' and the third area TW-c1' of the second touch signal line SL2-5'.

The first metal wire SL2-51' of the second touch signal line SL2-5' may have a first width W5 in the second direction DR2 in the first area TW-a1', and may have a second width W6 in the second direction DR2 in the second area TW-b1' and the third area TW-c1'. The second metal wire SL2-52' of the second touch signal line SL2-5' may have a third width W7 in the second direction DR2. In this case, the first width W5 and the third width W7 may be substantially equal to each other, and the second width W6 may be greater than the first width W5.

The plurality of second contact holes CH2 may be disposed in the first area TW-a1' of the first metal wire SL2-51' and the second metal wire SL2-52' of the second touch signal line SL2-5', and the second contact hole CH2 may not be disposed in the second area TW-b1' and the third area TW-c1'.

The first touch signal line SL1-1' may include a first area TW-a2' that does not to overlap the protrusion member DAM, and a second area TW-b2' that overlaps the protrusion member DAM. However, a portion of the second area TW-b2' may not overlap the protrusion member DAM for the process margin.

The first touch signal line SL1-1' may further include a third area TW-c2' protruded from the second area TW-b2'. The third area TW-c2' may be disposed to overlap the protrusion member DAM. However, a portion of the third area TW-c2' may not overlap the protrusion member DAM for the process margin.

According to an exemplary embodiment, a length of the third area TW-c2' in the first direction DR1 may be substantially equal to a length of the second area TW-b2' in the first direction DR1, and a width of the third area TW-c2' in the second direction DR2 may be less than half of the shortest distance between adjacent touch signal lines SL2-5' and SL1-1'. More particularly, the third area TW-c1' of the second touch signal line SL2-5' and the third area TW-c2' of the first touch signal line SL1-1' may not overlap on a plane.

The third area TW-c2' may have substantially a quadrangular shape on a plane. However, the planar shape of the third area TW-c2' is not limited thereto, and may have various shapes as long as the third area TW-c2' does not overlap a third area of an adjacent touch signal line. For example, the third area TW-c2' may have a polygon shape including a rhombus shape and an elliptical shape including a semicircle shape on a plane.

The first touch signal line SL1-1' may be disposed so that a first metal wire SL1-11' and a second metal wire SL1-12' overlap in the first area TW-a2'. Only the second metal wire SL1-12' may be disposed in the second TW-b2' and the third area TW-c2' of the first touch signal line SL1-1'.

The second metal wire SL1-12' of the first touch signal line SL1-1' may have a first width W8 in the second direction DR2 in the first area TW-a2', and may have a second width W9 in the second direction DR2 in the second area TW-b2' and the third area TW-c2'. The first metal wire SL1-11' of the first touch signal line SL1-1' may have a third width W10 in the second direction DR2. In this case, the first width W8 and the third width W10 may be substantially equal to each other, and the second width W9 may be greater than the first width W8.

The plurality of second contact holes CH2 may be disposed in the first area TW-a2' of the first metal wire SL1-11' and the second metal wire SL1-12' of the first touch signal line SL1-1', and the second contact hole CH2 may not be disposed in the second area TW-b2 'and the third area TW-c2'.

Referring to FIGS. 6, 7 and 17 to 19, in the wire portion TW, a signal line having the same stack structure as the first touch signal line SL1-1' and a signal line having the same stack structure as the second touch signal lines SL2-5' may be alternately disposed along the extension direction of the protrusion member DAM.

For example, the first touch signal lines SL1-3 and the second touch signal lines SL2-2 and SL2-4 may have the same stack structure as the first touch signal lines SL1-1', and the first touch signal lines SL1-2 and SL1-4 and the second touch signal lines SL2-1 and SL2-3 may have the same stack structure as the second touch signal line SL2-5'.

According to an exemplary embodiment, the display device DD having the structure of the wire portion TW described above may reduce a resistance of the wire portion TW.

When the wire portion TW has the double wire structure, in which the first and second conductive layers TS-CL1 and TS-CL2 are stacked, in a region that does not overlap the protrusion member DAM, and the wire portion TW has the single wire structure, in which only any one conductive layer of the first and second conductive layers TS-CL1 and TS-CL2, in a region overlapping the protrusion portion DAM, the resistance of the wire portion TW in the region overlapping the protrusion member DAM may be may be greater than a resistance of the double wire structure in which the first and second conductive layers TS-CL1 and TS-CL2 are stacked. However, the wire portion TW according to an exemplary embodiment may reduce the resistance of the wire portion TW by increasing the area of the wire passing through the region overlapping the protrusion member DAM.

Figure 20:
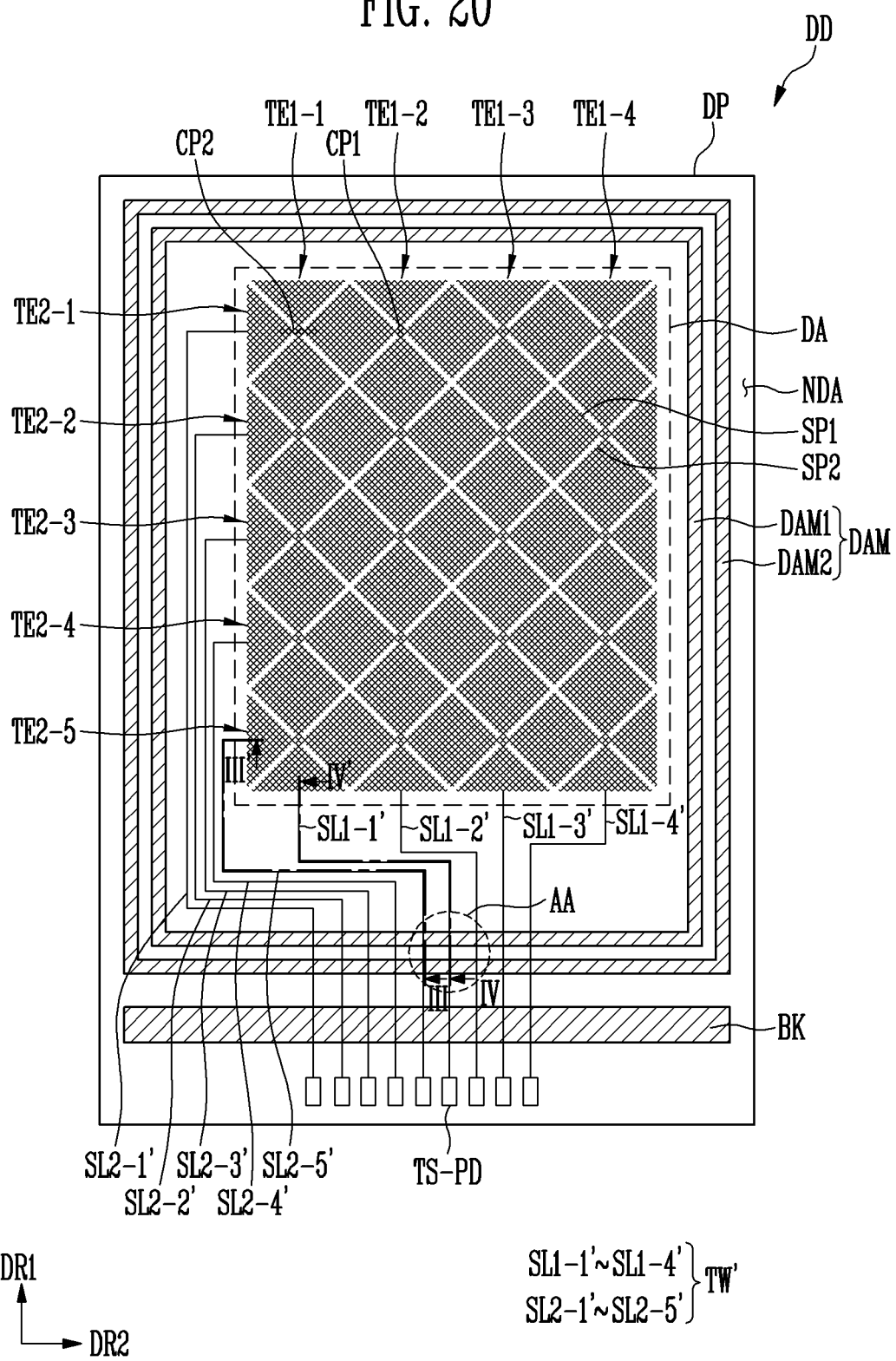
FIG. 20 is a plan view of the display device according to an exemplary embodiment.
Figure 21:
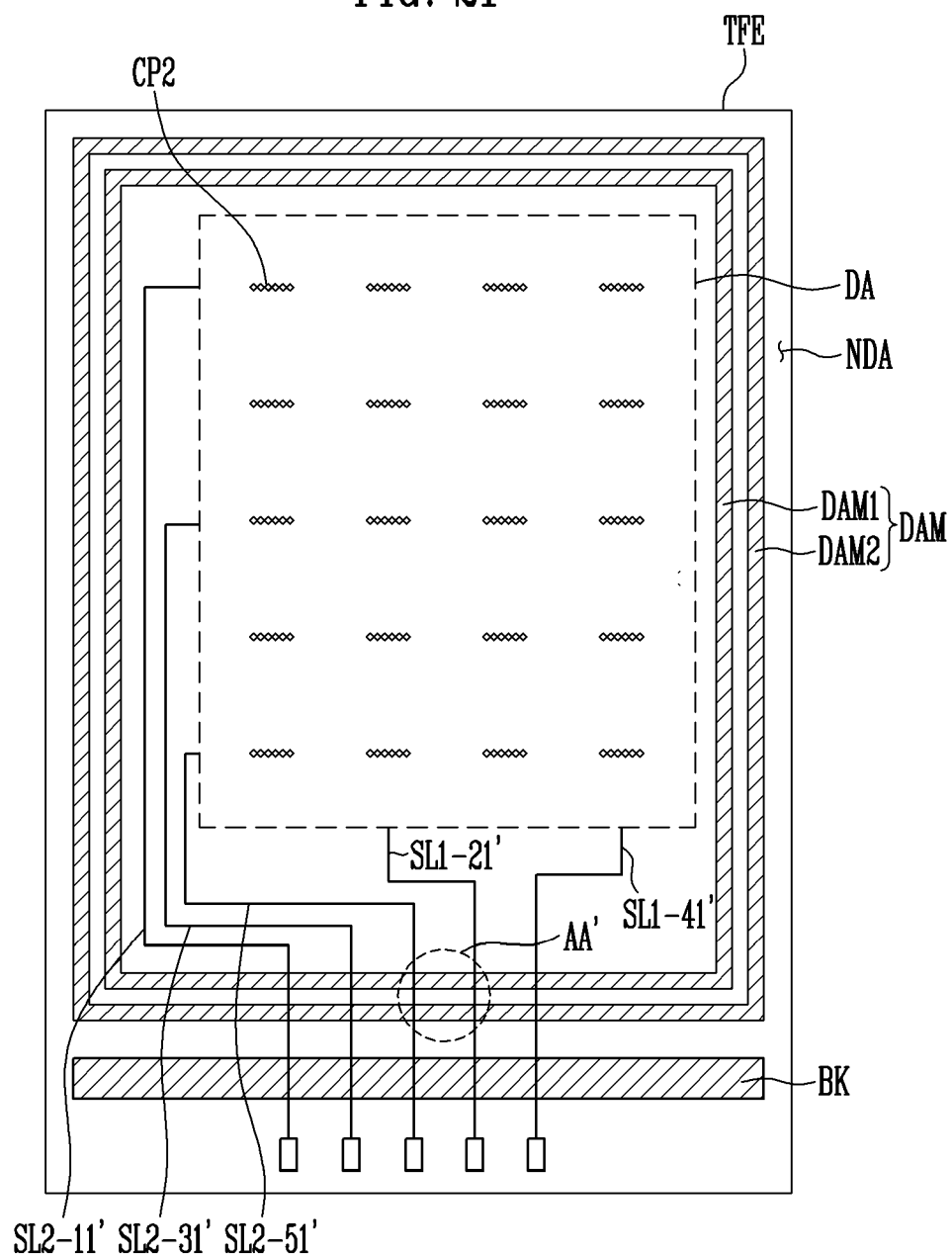
FIGS. 21, 22, and 23 are plan views of the touch sensing unit according to an exemplary embodiment.
Figure 22:
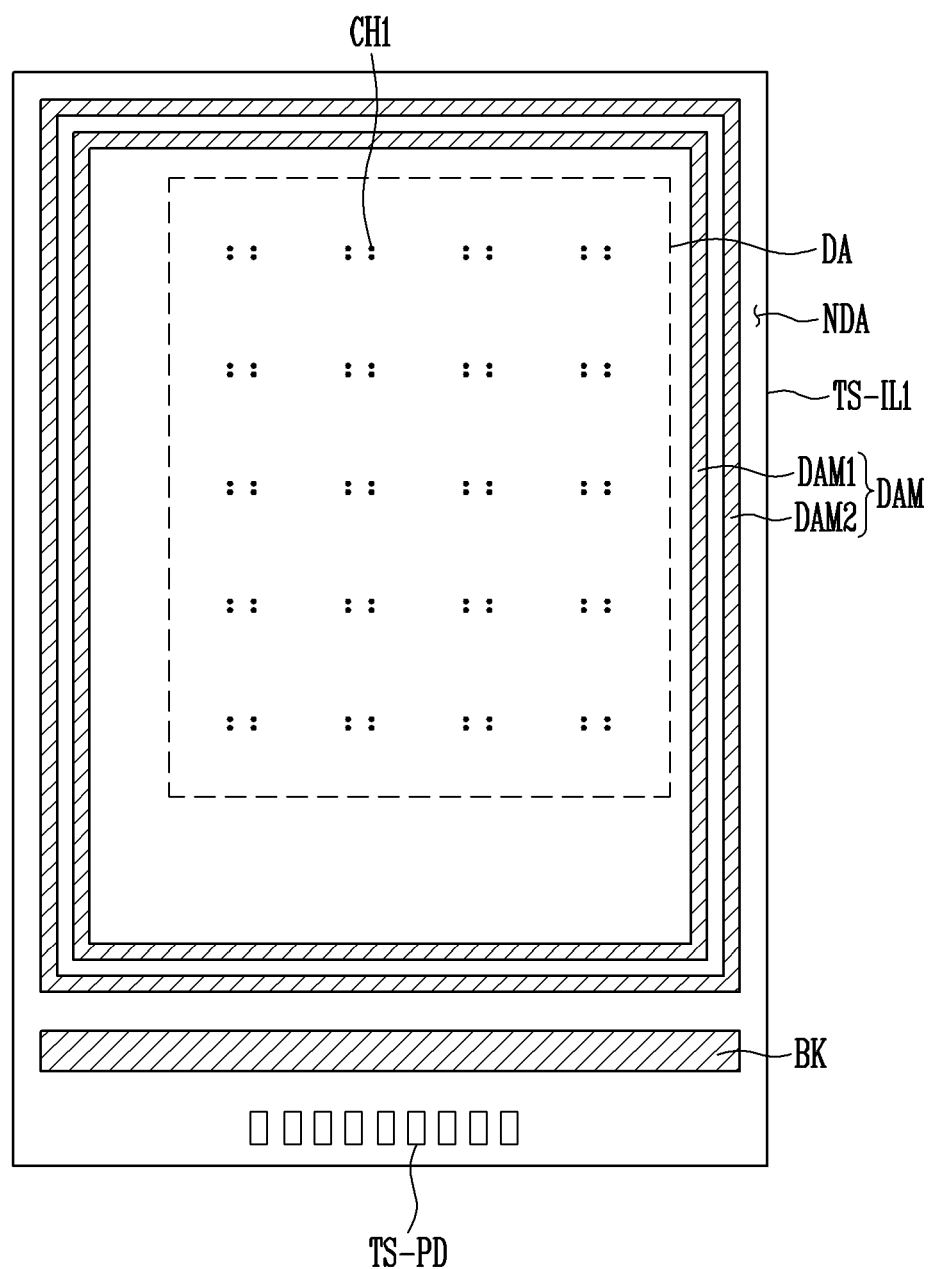
Figure 23:
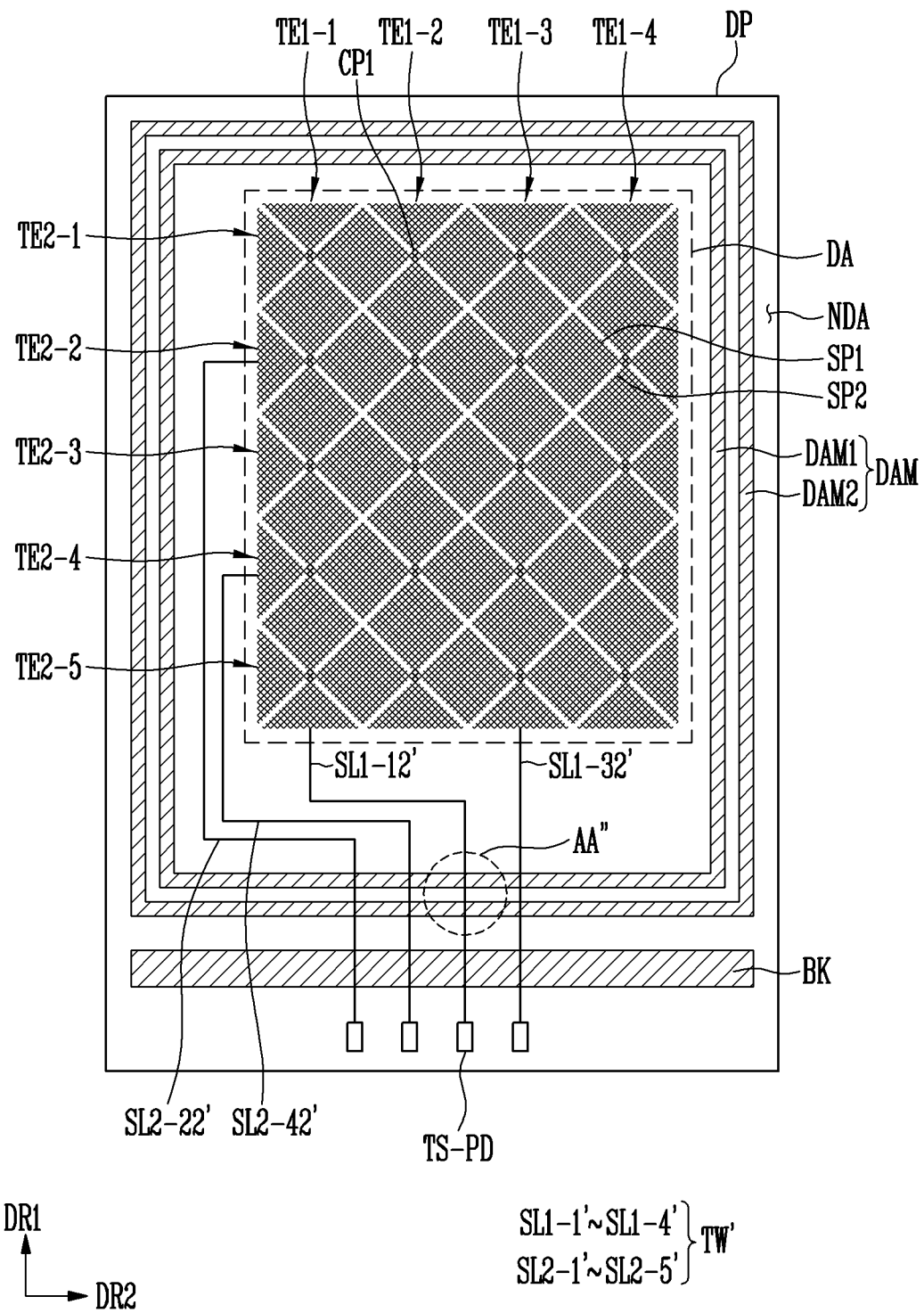
Figure 24:
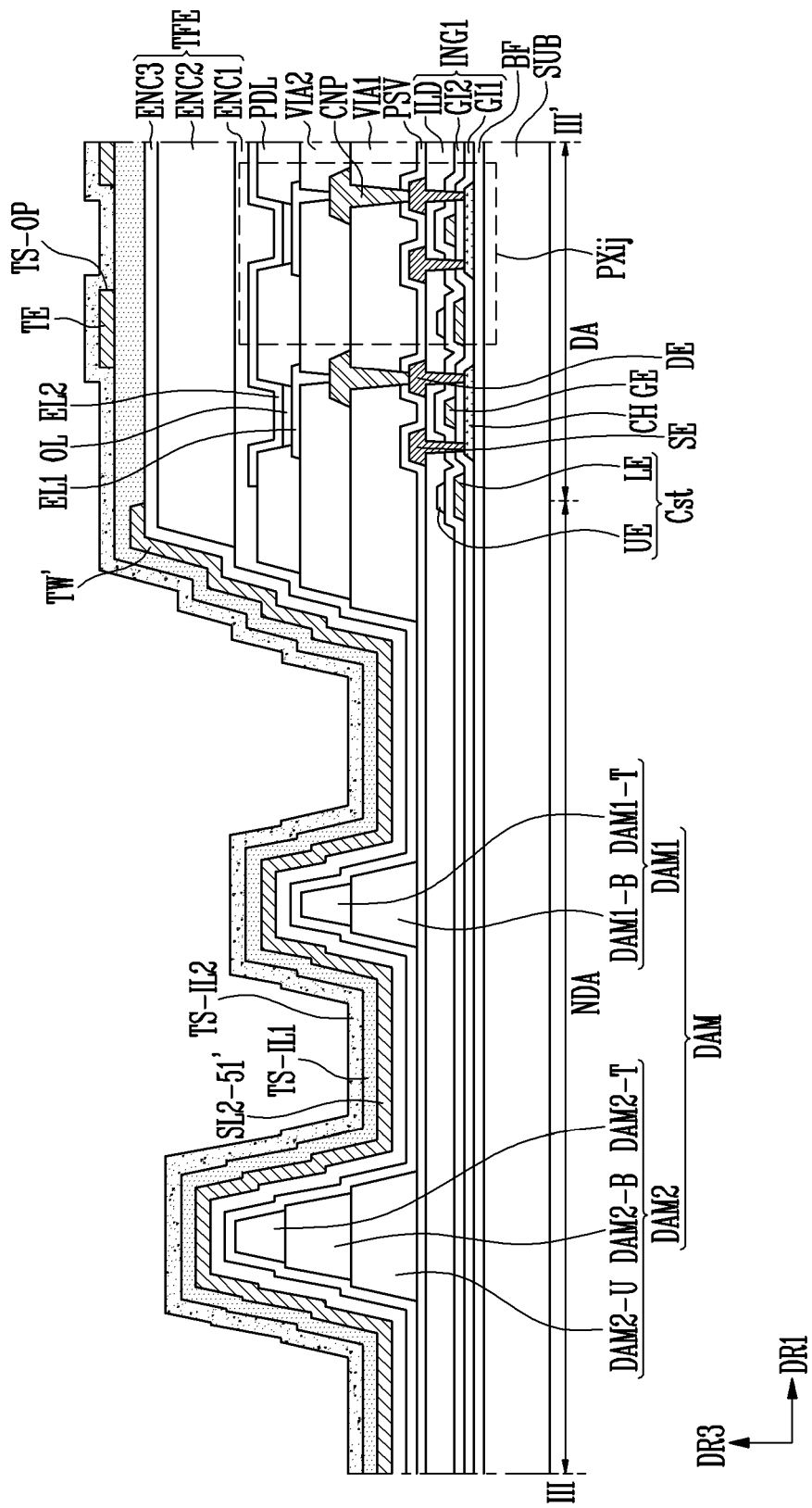
FIG. 24 is a cross-sectional view taken along line of FIG. 20 according to an exemplary embodiment.
Figure 25:
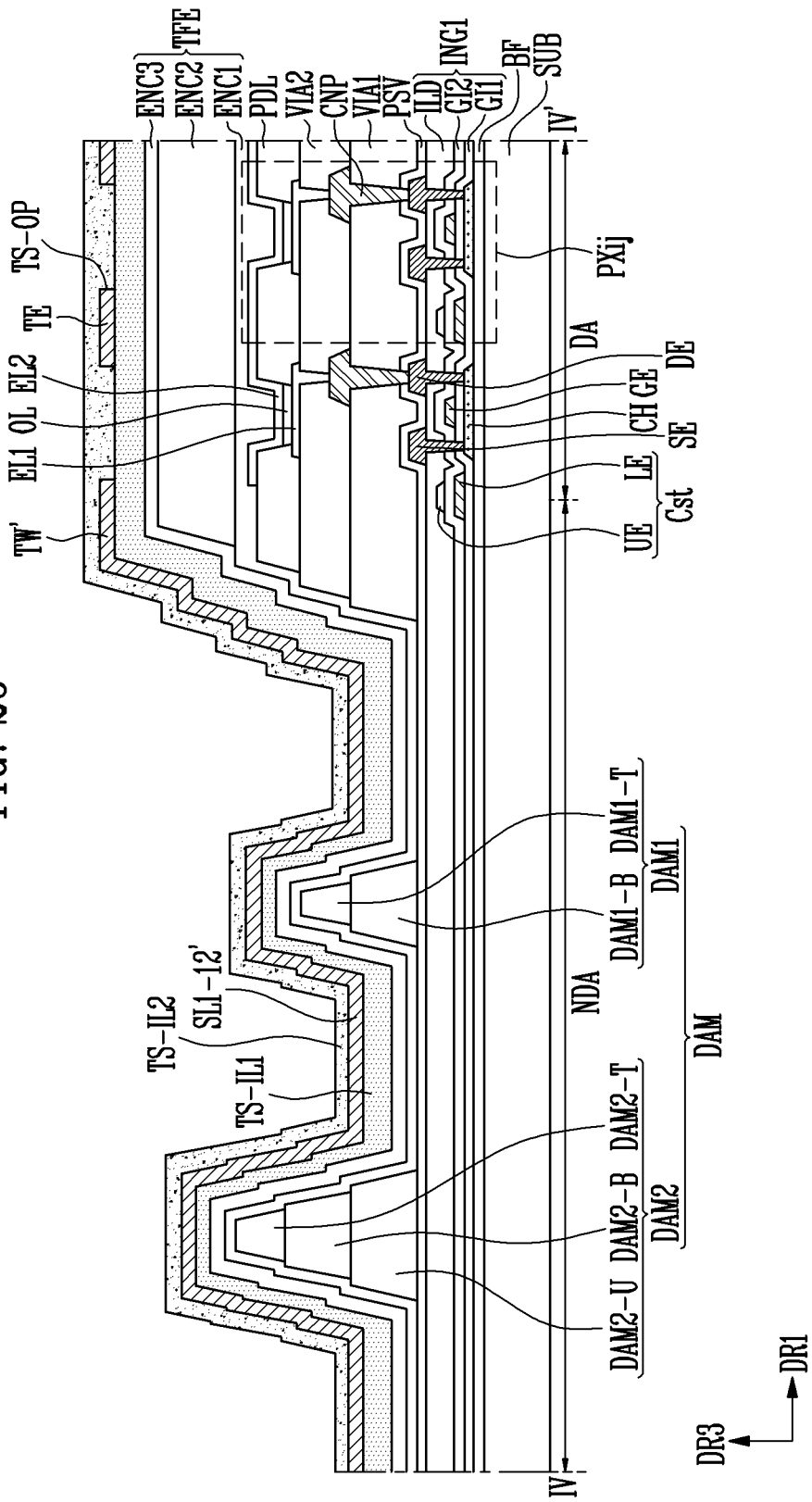
FIG. 25 is a cross-sectional view taken along line IV-IV' of FIG. 20 according to an exemplary embodiment.
Figure 26:
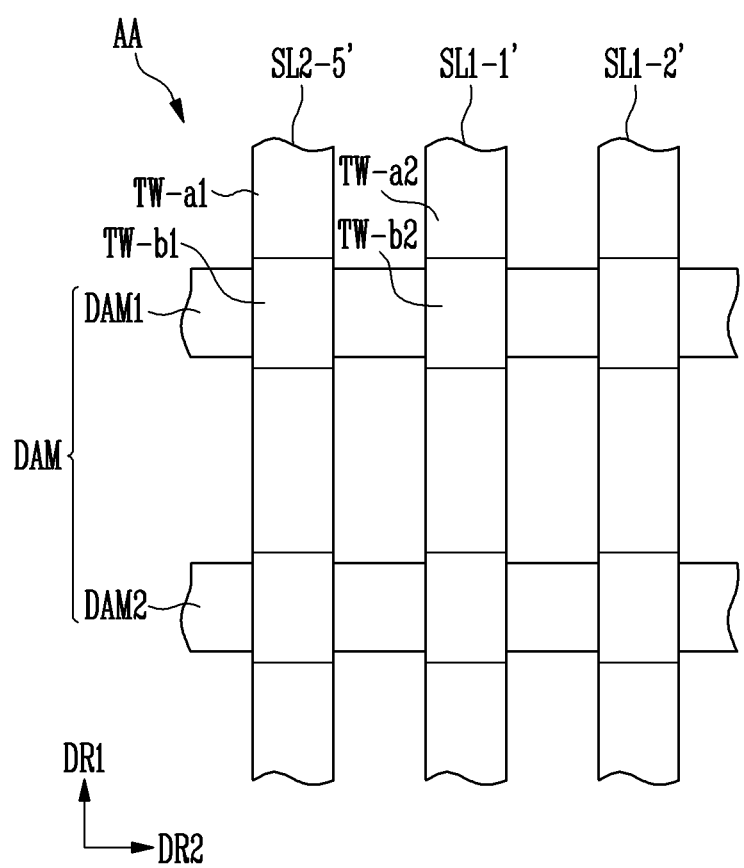
FIG. 26 is an enlarged view of region AA of FIG. 20 according to an exemplary embodiment.
Figure 27:
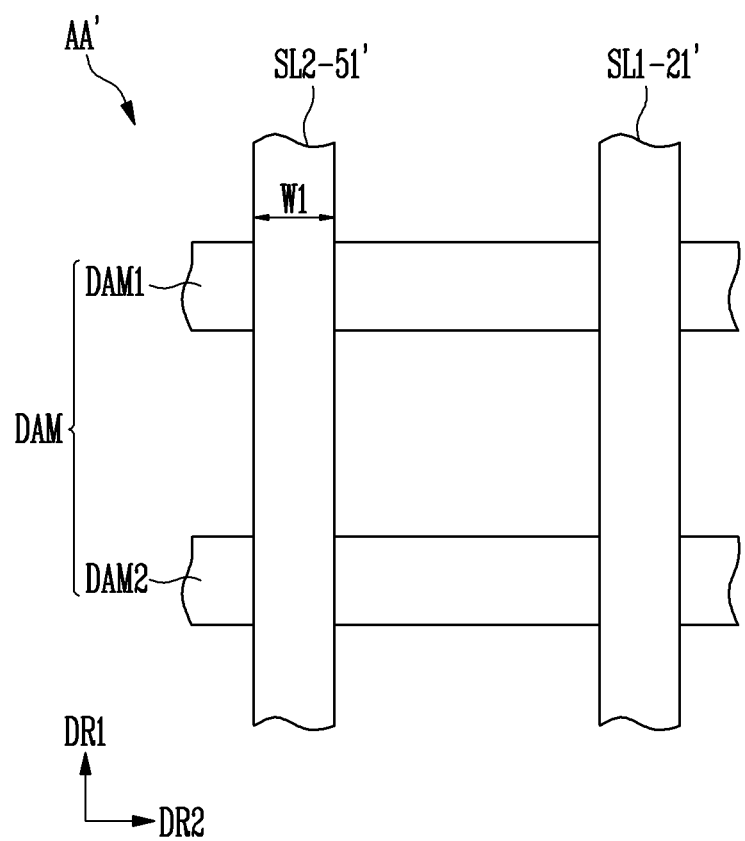
FIG. 27 is an enlarged view of region AA' of FIG. 21 according to an exemplary embodiment.
Figure 28:
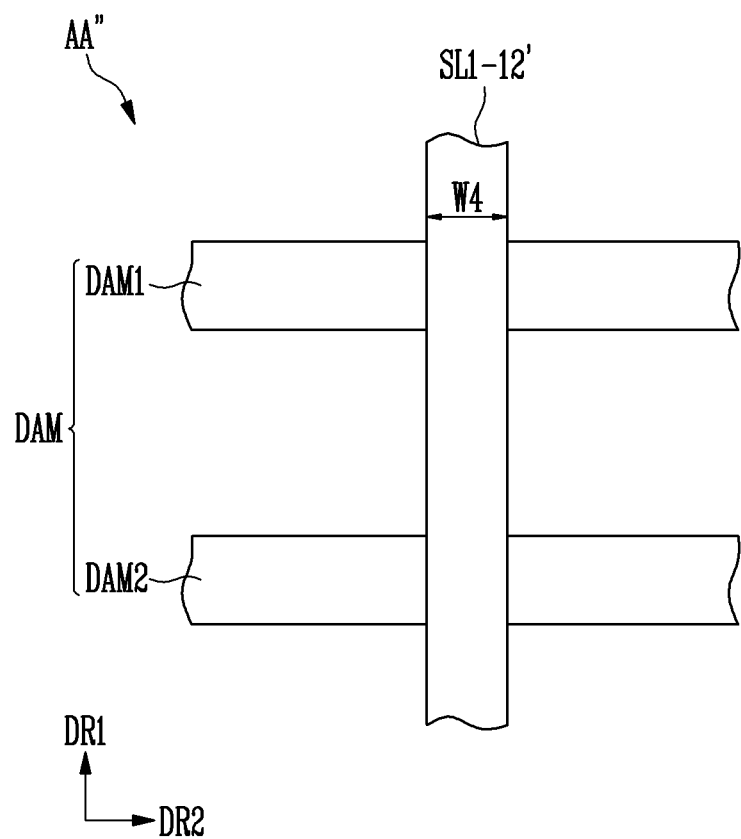
FIG. 28 is an enlarged view of region AA" of FIG. 23 according to an exemplary embodiment.

FIG. 20 is a plan view of the display device according to an exemplary embodiment. FIGS. 21 to 23 are plan views of the touch sensing unit according to an exemplary embodiment. FIG. 24 is a cross-sectional view taken along line of FIG. 20 according to an exemplary embodiment FIG. 25 is a cross-sectional view taken along line IV-IV' of FIG. 20 according to an exemplary embodiment. FIG. 26 is an enlarged view of region AA of FIG. 20 according to an exemplary embodiment. FIG. 27 is an enlarged view of region AA' region of FIG. 21 according to an exemplary embodiment. FIG. 28 is an enlarged view of region AA" of FIG. 23 according to an exemplary embodiment.

Referring to FIGS. 20 to 28, the display device of FIGS. 20 to 28 is different from that shown in FIGS. 7 to 16, in that first touch signal lines SL1-1' to SL1-4' and second touch signal lines SL2-1' to SL2-5' are formed to have a single wire structure.

More particularly, in the plan view of FIG. 20, the touch sensing unit TS may include the first touch electrodes TE1-1 to TE1-4, the first touch signal lines S:1-1' to SL1-4' connected to the first touch electrodes TE1-1 to TE1-4, the second touch signals TE2-1 to TE2-5, and the second touch signal lines SL2-1' to SL2-5' connected to the second touch electrodes TE2-1 to TE2-5.

In FIG. 20, the first touch signal lines SL1-1' to SL1-4' and the second touch signal lines SL2-1' to SL2-5' connected between the touch electrode TE and the touch pad TS-PD correspond to the wire portion TW'.

Referring to FIGS. 21 to 23, the wire portion TW' may have a single wire structure formed of any one of the first metal wires SL1-11' to SL1-41' and SL2-11' to SL2-51' and the second metal wire SL1-12' to SL1-42' and SL2-12' to SL2-52'.

According to an exemplary embodiment, adjacent touch signal lines among the first touch signal lines SL1-1' to SL1-4' and the second touch signal lines SL2-1' to SL2-5' may be alternately formed in different layers based on the first insulating layer TS-IL1.

For example, the first touch signal lines SL1-1' to SL1-4' may include first metal wires SL1-21' and SL1-41' and the second metal wires SL1-12' and SL1-32', and the second touch signal lines SL2-1' to SL2-5' may include first metal wires SL2-11' and SL2-31' and second metal wires SL2-22' and SL2-42'.

The first metal wires SL1-21', SL1-41', SL2-11', SL2-31', and SL2-51' may be disposed on the encapsulation layer TFE, the first insulating layer TS-CL1 may be interposed between the first metal wires SL1-21', SL1-41', SL2-11', SL2-31', and SL2-51' and the second metal wires SL1-12', SL1-32', SL2-22', and SL2-42'.

Meanwhile, the first insulating layer TS-IL1 interposed between the first metal wires SL1-21', SL1-41', SL2-11', SL2-31', and SL2-51' and the second metal wires SL1-12', SL1-32', SL2-22', and SL2-42' may not include the second contact holes CH2, differently from the that shown in FIGS. 7 to 16.

When the adjacent touch signal lines among the first touch signal lines SL1-1' to SL1-4' and the second touch signal lines SL2-1' to SL2-5' of the wire portion TW' are alternately formed in different layers based on the first insulating layer TS-IL1, a short occurrence of the wire portion TW' may be reduced, and a distance between the touch signal lines on a plane may be reduced. In this manner, a dead space of the display panel DP may be reduced.

Referring to FIGS. 6, 20, 24, and 25, the wire portion TW' may include the first conductive layer TS-CL1, the first insulating layer TS-CL1 disposed on the first conductive layer TS-CL1, and the second conductive layer TS-CL2 disposed on the first insulating layer TS-IL1.

Referring to FIGS. 20 and 24, the wire portion TW' is exemplarily illustrated as the second touch signal line SL2-5'. The second touch signal line SL2-5' may include the first metal wire SL2-51' formed of the first conductive layer TS-CL1. The first metal wire SL2-51' of the second touch signal line SL2-5' may be continuously extended without disconnection along the first direction DR1 on the non-display area NDA including the protrusion member DAM.

Referring to FIG. 25, the wire portion TW' is exemplarily illustrated as the touch signal line SL1-1'. The first touch signal line SL1-1' may include the second metal wire SL1-12' formed of the second conductive layer TS-CL2. The second metal wire SL1-12' of the first touch signal line SL1-1' may be continuously extended without disconnection along the first direction DR1 on the non-display area NDA including the protrusion member DAM. The second insulating layer TS-IL2 may be disposed on the second metal wire SL1-12' of the first touch signal line SL1-1'.

FIG. 26 is an enlarged view of region AA of FIG. 20 according to an exemplary embodiment. FIG. 27 is an enlarged view of region AA' of FIG. 21 according to an exemplary embodiment. FIG. 28 is an enlarged view of region AA'' of FIG. 23 according to an exemplary embodiment.

Referring to FIGS. 26 to 28, the wire portion TW' is exemplarily illustrated as including the first touch signal lines SL1-1' and SL1-2' and the second touch signal line SL2-5'. The first touch signal lines SL1-1' and SL1-2' and the second touch signal line SL2-5' may be extended along the first direction DR1 and may be disposed adjacent to each other along the second direction DR2. The protrusion members DAM may be extended along the second direction DR2 and may be adjacent to each other along the first direction DR1.

Hereinafter, the wire portion TW' according to an exemplarily embodiment will be described with reference to the first touch signal line SL1-1' and the second touch signal line SL2-5'.

According to an exemplary embodiment, the second touch signal line SL2-5' may include the first area TW-a1 that does not overlap the protrusion member DAM, and the second area TW-b1 that overlaps the protrusion member DAM. However, a portion of the second area TW-b1 may not overlap the protrusion member DAM for the process margin.

Only the first metal wire SL2-51' may be disposed in the first area TW-a1 and the second area TW-b1 of the second touch signal line SL2-5'.

The first metal wire SL2-51' of the second touch signal line SL2-5' may have the first width W1 in the second direction DR2.

The first touch signal line SL1-1' may include the first area TW-a2 that does not overlap the protrusion member DAM, and the second area TW-b2 that overlaps the protrusion member DAM. Only the second metal wire SL1-12' may be disposed in the first area TW-a2 and the second area TW-b2 of the first touch signal line SL1-1'.

The second metal wire SL1-12' of the first touch signal line SL1-1' may have the second width W4 in the second direction DR2.

Referring to FIGS. 6, 20, and 26 to 28, in the wire portion TW', the signal line having the same stack structure as the first touch signal line SL1-1' and the signal line having the same stack structure as the second touch signal line SL2-5' may be alternately disposed along the extension direction of the protrusion member DAM.

For example, the first touch signal lines SL1-3' and the second touch signal lines SL2-2' and SL2-4' may have the same stack structure as the first touch signal line SL1-1', and the first touch signal lines SL1-2' and SL1-4' and the second touch signal lines SL2-1' and SL2-3' may have the same stack structure as the second touch signal line SL2-5'.

According to an exemplary embodiment, the display device DD having the structure of the wire portion TW' described above may improve a short defect between the wire portions TW'.

Display device according to embodiments of the present disclosure may prevent a short defect between adjacent wire portions by disposing the adjacent wire portions in different layers in forming the wire portions disposed to overlap the protrusion member.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel including a display area, a non-display area, and a plurality of protrusion members disposed in the non-display area; and
a plurality of touch sensing layers disposed on the display panel and comprising a touch electrode and a wire portion connected to the touch electrode,
wherein the touch sensing layers comprise a first metal layer, a first insulating layer disposed on the first metal layer, a second metal layer disposed on the first insulating layer, and a plurality of contact holes disposed between the first metal layer and the second metal layer,
wherein the wire portion has a double wire structure including the first metal layer and the second metal layer in the non-display area, and has a single wire structure including any one of the first metal layer and the second metal layer on the protrusion member,
wherein the wire portion comprises a plurality of first touch signal lines and a plurality of second touch signal lines that are alternately disposed along an extension direction of the protrusion members, and
wherein among the first metal layer and the second metal layer, a metal layer included in the single wire structure of the first touch signal lines and a metal layer included in the single wire structure of the second touch signal lines are different from each other.

2. The display device according to claim 1, wherein the first touch signal lines and the second touch signal lines extend in a direction crossing the extension direction of the protrusion member.

3. The display device according to claim 2, wherein:
a first metal wire of the first touch signal lines including the first metal layer overlaps the protrusion member, and a second metal wire of the first touch signal lines including the second metal layer does not overlap the protrusion member; and
a first metal wire of the second touch signal lines including the first metal layer does not overlap the protrusion member, and a second metal wire of the second touch signal lines including the second metal layer overlaps the protrusion member.

4. The display device according to claim 3, wherein a width of the first metal wire of the first and second touch signal lines and a width of the second metal wire of the first and second touch signal lines are substantially the same.

5. The display device according to claim 4, wherein the first metal layer of the first and second touch signal lines and the second metal layer of the first and second touch signal lines are electrically connected to each other through the contact holes.

6. The display device according to claim 1, wherein the touch electrode comprises a plurality of first touch electrodes extending in a first direction and second touch electrodes extending in a second direction crossing the first direction.

7. The display device according to claim 6, wherein:
the first touch electrodes comprise a plurality of first touch sensor portions and a plurality of first connection portions connecting the first touch sensor portions; and
the second touch electrodes comprise a plurality of second touch sensor portions and a plurality of second connection portions connecting the second touch sensor portions.

8. The display device according to claim 7, wherein:
the first touch sensor portions, the first connection portions, and the second touch sensor portions include the second metal layer; and
the second connection portions include the first metal layer.

9. The display device according to claim 6, wherein the first touch electrodes and the second touch electrodes cross each other and are insulated from each other by the first insulating layer.

10. The display device according to claim 1, wherein the protrusion member comprises a first protrusion member disposed to surround the display area, a second protrusion member disposed to surround the first protrusion member, and a bank portion disposed on an outer side of the second protrusion member.

11. The display device according to claim 10, further comprising a pad electrode disposed on an outer side of the bank portion,
wherein the wire portion connects the touch electrode and the pad electrode to each other.

12. The display device according to claim 10, wherein a height of the second protrusion member is greater than a height of the first protrusion member.

13. The display device according to claim 12, wherein the touch sensing layers further comprise a second insulating layer disposed on the second metal layer.

14. A display device comprising:
a base substrate divided into a display area and a non-display area adjacent to the display area;
a circuit layer disposed on the base substrate;
a light emitting element layer on the display area;
an encapsulation layer covering the light emitting element layer;
a plurality of touch sensing layers disposed on the encapsulation layer and comprising a touch electrode and a wire portion connected to the touch electrode; and
a protrusion member disposed in the non-display area,
wherein the touch sensing layers comprise a first metal layer, a first insulating layer disposed on the first metal layer, a second metal layer disposed on the first insulating layer, and a plurality of contact holes disposed between the first metal layer and the second metal layer,
wherein the wire portion has a double wire structure including the first metal layer and the second metal layer in the non-display area, and has a single wire structure including any one of the first metal layer and the second metal layer on the protrusion member,
wherein the wire portion comprises a plurality of first touch signal lines and a plurality of second touch signal lines that are alternately disposed along an extension direction of the protrusion member; and
wherein among the first metal layer and the second metal layer, a metal layer included in the single wire structure of the first touch signal lines and a metal layer included in the single wire structure of the second touch signal lines are different from each other.

15. The display device according to claim 14, wherein the first touch signal lines and the second touch signal lines extend in a direction crossing the extension direction of the protrusion member.

16. The display device according to claim 15, wherein:
a first metal wire of the first touch signal lines including the first metal layer overlaps the protrusion member, and a second metal wire of the first touch signal lines including the second metal layer does not overlap the protrusion member; and
a first metal wire of the second touch signal lines including the first metal layer does not overlap the protrusion member, and a second metal wire of the second touch signal lines including the second metal layer overlaps the protrusion member.

17. The display device according to claim 16, wherein the first metal layer of the first and second touch signal lines and the second metal layer of the first and second touch signal lines are electrically connected to each other through the contact holes.

18. The display device according to claim 17, wherein the touch sensing layers further comprise a second insulating layer disposed on the second metal layer.

19. The display device according to claim 18, wherein the encapsulation layer comprises a first inorganic layer, a second inorganic layer, and an organic layer interposed between the first inorganic layer and the second inorganic layer.

20. The display device according to claim 19, wherein the first inorganic layer and the second inorganic layer of the encapsulation layer are sequentially stacked on the protrusion member.

* * * * *